(12) United States Patent
Kim et al.

(10) Patent No.: US 10,930,703 B2
(45) Date of Patent: Feb. 23, 2021

(54) HIGH DENSITY MRAM INTEGRATION

(71) Applicant: Spin Memory, Inc., Fremont, CA (US)

(72) Inventors: Kuk-Hwan Kim, San Jose, CA (US); Dafna Beery, Palo Alto, CA (US); Marcin Gajek, Berkeley, CA (US); Michail Tzoufras, Sunnyvale, CA (US); Kadriye Deniz Bozdag, Sunnyvale, CA (US); Eric Michael Ryan, Fremont, CA (US); Satoru Araki, San Jose, CA (US); Andrew J. Walker, Mountain View, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/237,194

(22) Filed: Dec. 31, 2018

(65) Prior Publication Data

US 2020/0013828 A1    Jan. 9, 2020

Related U.S. Application Data

(60) Provisional application No. 62/694,911, filed on Jul. 6, 2018.

(51) Int. Cl.
| | |
|---|---|
| *H01L 27/22* | (2006.01) |
| *H01L 43/12* | (2006.01) |
| *G11C 11/16* | (2006.01) |
| *H01L 43/08* | (2006.01) |
| *H01L 43/02* | (2006.01) |
| *H01L 43/10* | (2006.01) |

(52) U.S. Cl.
CPC .......... *H01L 27/228* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/228; H01L 43/02; H01L 43/08; H01L 43/10; H01L 43/12; G11C 11/161
USPC ....... 257/421, 208, 329, 330, 334, 499, 565, 257/E27.046, E27.062, E21.001, E21.004, 257/E21.632, E21.652, E21.655, E21.659, 257/E29.262, E29.323; 365/158, 174, 365/200; 438/270, 3, 309, 382
See application file for complete search history.

(56) References Cited

U.S. PATENT DOCUMENTS

| | | |
|---|---|---|
| 9,640,636 B1 | 5/2017 | Bentley et al. |
| 10,686,009 B2 | 6/2020 | Kim et al. |

(Continued)

OTHER PUBLICATIONS

Kim et al., U.S. Appl. No. 16/237,171, filed Dec. 31, 2018.

(Continued)

*Primary Examiner* — Dao H Nguyen
(74) *Attorney, Agent, or Firm* — Zilka-Kotab, P.C.

(57) ABSTRACT

A method for crystalized silicon structures from amorphous structures in a magnetic memory array, wherein the temperature needed to crystalize the amorphous silicon is lower than the temperature budget of the memory element so as to avoid damage to the memory element. An amorphous silicon is deposited, followed by a layer of Ti or Co. An annealing process is then performed which causes the Ti or Co to form $TiSi_2$ or $CoSi_2$ and also causes the underlying amorphous silicon to crystallize.

14 Claims, 42 Drawing Sheets

(56) References Cited

U.S. PATENT DOCUMENTS

| | | | | |
|---|---|---|---|---|
| 2010/0052029 A1* | 3/2010 | Huang | ............... | H01L 27/10876 257/309 |
| 2010/0059837 A1* | 3/2010 | Kim | ................ | H01L 27/228 257/421 |
| 2011/0253981 A1 | 10/2011 | Rooyackers et al. | | |
| 2012/0080725 A1* | 4/2012 | Manos | ................ | H01L 27/228 257/208 |
| 2014/0061745 A1* | 3/2014 | Myung | ................ | H01L 21/743 257/302 |
| 2014/0110816 A1 | 4/2014 | Kim et al. | | |
| 2014/0339631 A1* | 11/2014 | Ting | ................ | H01L 27/228 257/334 |
| 2015/0129945 A1 | 5/2015 | Nakatsuka | | |
| 2016/0013292 A1 | 1/2016 | Choi | | |
| 2016/0233333 A1* | 8/2016 | Toh | ................ | H01L 43/12 |
| 2016/0260775 A1 | 9/2016 | Takaki | | |
| 2020/0013827 A1 | 1/2020 | Kim et al. | | |

OTHER PUBLICATIONS

Herner et al., "Polysilicon Memory Switching: Electrothermal-Induced Order," IEEE Transactions on Electron Devices, vol. 53, No. 9, Sep. 2006, pp. 2320-2327.

Capogreco et al., "Integration and Electrical evaluation of epitaxially grown Si and SiGe channels for vertical NAND Memory applications," IEEE International Memory Workshop (IMW), Jul. 2015, 5 pages.

Yoon et al., "Metal-induced crystallization of amorphous silicon," Thin Solid Films, vol. 383, Feb. 15, 2001, pp. 34-38.

Kamins et al., "Ti-catalyzed Si nanowires by chemical vapor deposition: Microscopy and growth mechanisms," Journal of Applied Physics, vol. 89, No. 2, Jan. 15, 2001, pp. 1008-1016.

Restriction Requirement from U.S. Appl. No. 16/237,171, dated Nov. 21, 2019.

Notice of Allowance from U.S. Appl. No. 16/237,171, dated Feb. 12, 2020.

* cited by examiner

HIGH DENSITY MRAM INTEGRATION

FIELD OF THE INVENTION

The present invention relates to magnetic random-access memory (MRAM) and more particularly to a method for manufacturing a high density array of magnetic random access memory elements.

RELATED APPLICATIONS

The present Application claims priority to Provisional Patent Application No. 62/694,911, entitled HIGH DENSITY MRAM APPLICATION, filed Jul. 6, 2018.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides structure and method for forming high quality silicon structures such as silicon pillar structures for use in transistor structures for switching and selecting magnetic memory elements in a magnetic random access memory array (MRAM array).

Recrystallizing amorphous channel materials (e.g. a-Si, a-Ge, a-$Si_xGe_{1-x}$) from lattice matched silicon surface requires growth from a crystalline silicon surface and treatment at high temperature (greater than 450 C). These requirements have limited applicability of the process to multi-layer MTJ integration such as for use in magnetic random access memory arrays (MRAM arrays).

The present invention provides an innovative mechanism for obtaining high quality channel materials for selector device integration. By forming silicon compound with specific phase and lattice constant at low temperature and subsequently inducing recrystallization of amorphous channel in the same index of underlying/capped silicon compound, high quality channel material can be prepared at low temperature in a cost-effective fashion.

This process resolves stringent requirements of conventional amorphous recrystallization processes such as the need for a specific seed material and high temperature treatment requirement. Such a process achieves recrystallization of amorphous silicon whose recrystallization index is taken from silicon compound material (e.g. $TiSi_2$, $NiSi_2$). Previously available processes have had limited applicability to magnetic memory, because they were only feasible in the thin-film phase or could only achieve recrystallization when performed at a temperature that was higher than MTJ thermal budget.

The invention provides a process integration scheme where silicon compound mediated recrystallization can be performed on deposited or grown amorphous channel fill to build a selector device such as a transistor. For example C49-phase TiSi$_2$ (210)(1.7%) or CoSi$_2$ (1.2%), NiSi$_2$ (0.4%) can be utilized as a seed layer for a/poly-Si, a/poly-SiGe, a/poly-Ge re-crystallization. Recrystallization could be either induced by post-silicidation annealing process or as being deposited on a lattice matched silicon compound. A target phase of the channel material after recrystallization process can include mono-crystalline, quasi-monocrystalline, poly-crystalline, or short-range to mid-range order crystalline structure as desired. The process can be performed using a small lattice mismatched silicon compound on top of amorphous-phase channel material or beneath amorphous-phase channel material. The process and structure can be achieved with various bottom electrode structures, including various bottom electrode materials, textures and crystalline phases. Preferably, this is performed using a bottom electrode that is formed of a non-reactive material during the amorphous channel material deposition. However, it is not limited to use of a crystalline phase silicon bottom electrode.

This can be used with a 1Tr-2R structure where 2R structures are located away from the growth direction of the vertical recrystallized channel, making common source line extendable between adjacent MTJ layers. An electrically conductive via such as a tungsten (W) plug can be used to extend electrical connection between adjacent magnetic element layers (e.g. magnetic tunnel junction element layers). In this case, the electrical resistance of the via (e.g. W plug) is preferably minimized to reduce parasitic effects. Alternatively, a Cu plug process could be used to save one metal deposition step by doing Cu plug and metal back end metallization together. The novel crystallization process advantageously provides a cost-effective multi-layer memory element integration process with -silicide mediated recrystallization channel.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
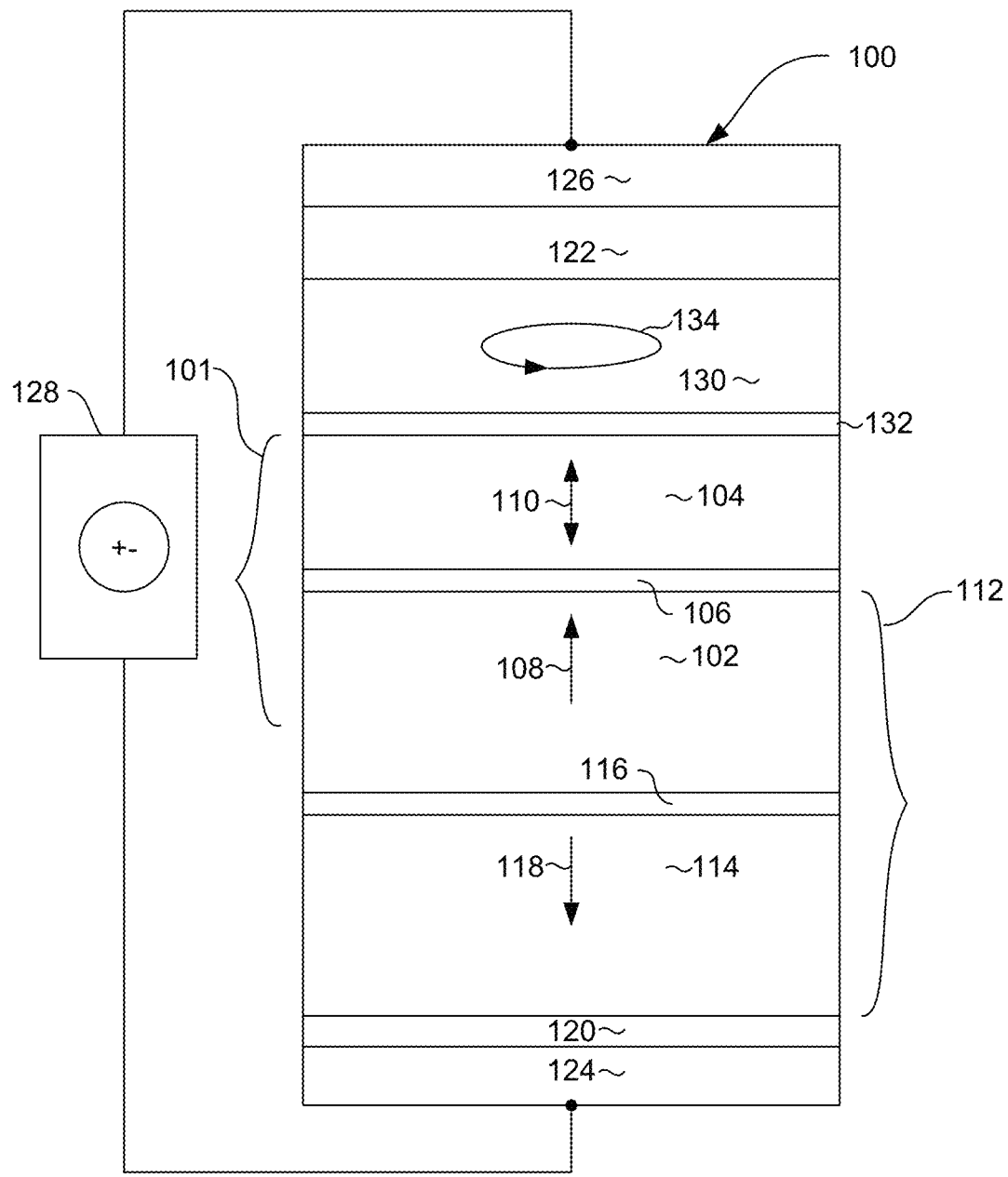
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Ta, W, and Al can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in-plane direction (e.g. perpendicular to the magnetizations 110, 108 of the free and reference layers 104, 102. The magnetization 134, of the spin polarization layer 130 may either be fixed or can move in a precessional manner as shown in FIG. 1. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
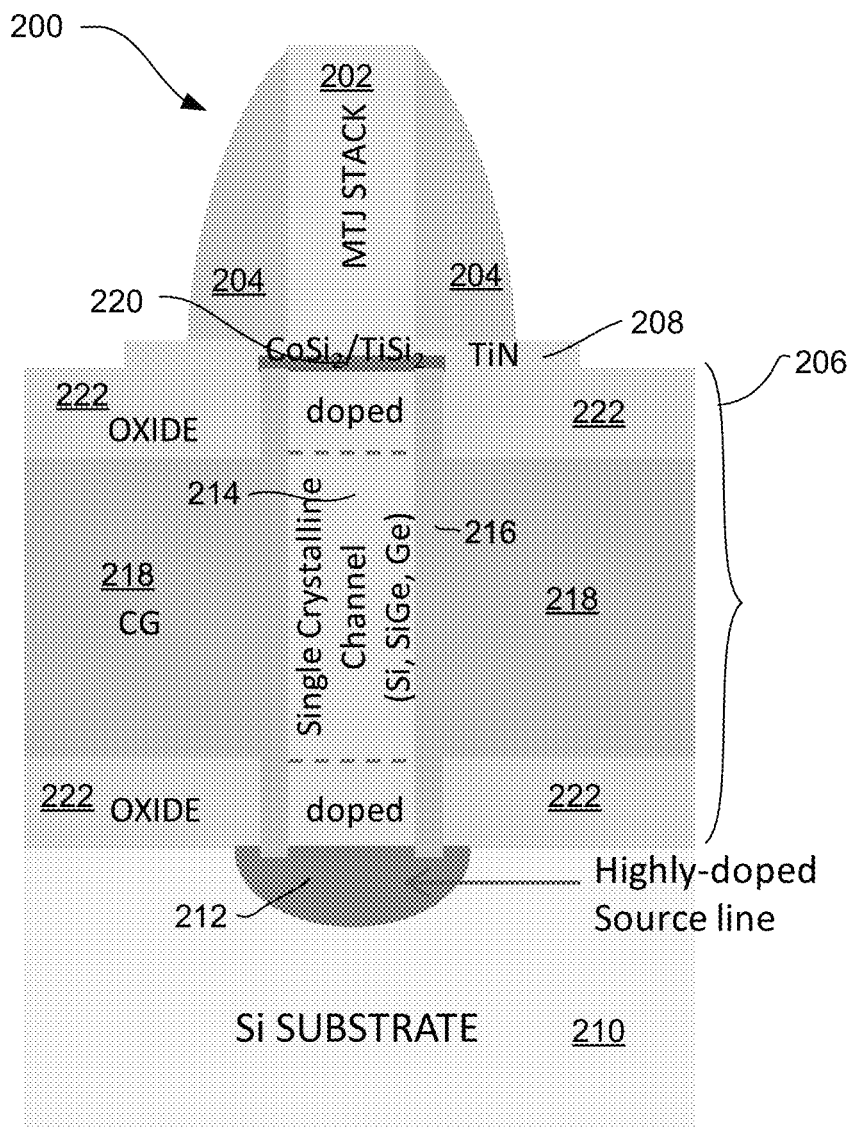
FIG. 2 is a cross-sectional view of a portion of a magnetic memory element array according to an embodiment.

FIG. 2 shows a cross-sectional view of a portion of a magnetic memory element array 200 that can include a magnetic memory element 202 such as a magnetic tunnel junction (MTJ), which can be surrounded at its sides by a dielectric isolation layer 204. The memory element 202 can be similar to the memory element 100 described above with reference to FIG. 1, or could be some other alternate design. The memory element 202 can be formed on a bottom electrode 208 that provides electrical connection with a selector structure 206. The bottom electrode 208 can be formed of an electrically conductive metal such as TiN.

The selector structure 206 is formed on a substrate 210 that can be a semiconductor material such as Si. The substrate 210 has a doped region 212 that serves as a source-line for the memory array 200. The selector structure 206 also includes a semiconductor pillar structure 214, that is surrounded at its side by a dielectric layer 216. The semiconductor pillar structure can be a material such as Si, SiGe or Ge and can be a single crystalline structure or another ordered structure such as poly-crystalline. A control gate 218 is separated from the semiconductor pillar 214 by the surrounding dielectric layer 216. The control gate 218 can be a material such as a poly-silicon and metal structure such as TiN, W, TaN. Dielectric layers 222 can be provided at the top and bottom of the control gate 218 to provide electrical isolation of the control gate 218.

A novel capping layer 220 is formed at the top of the semiconductor pillar structure 216. The capping layer 220 is formed of a silicide such as $CoSi_2$ or $TiSi_2$, and provides decided advantages in crystallizing the underlying silicon pillar structure 214, as will be described in greater detail herein below. The capping layer 220, which is in contact with the semiconductor pillar 216 can be located between the bottom electrode 208 and the semiconductor pillar 216.

Figure 3:
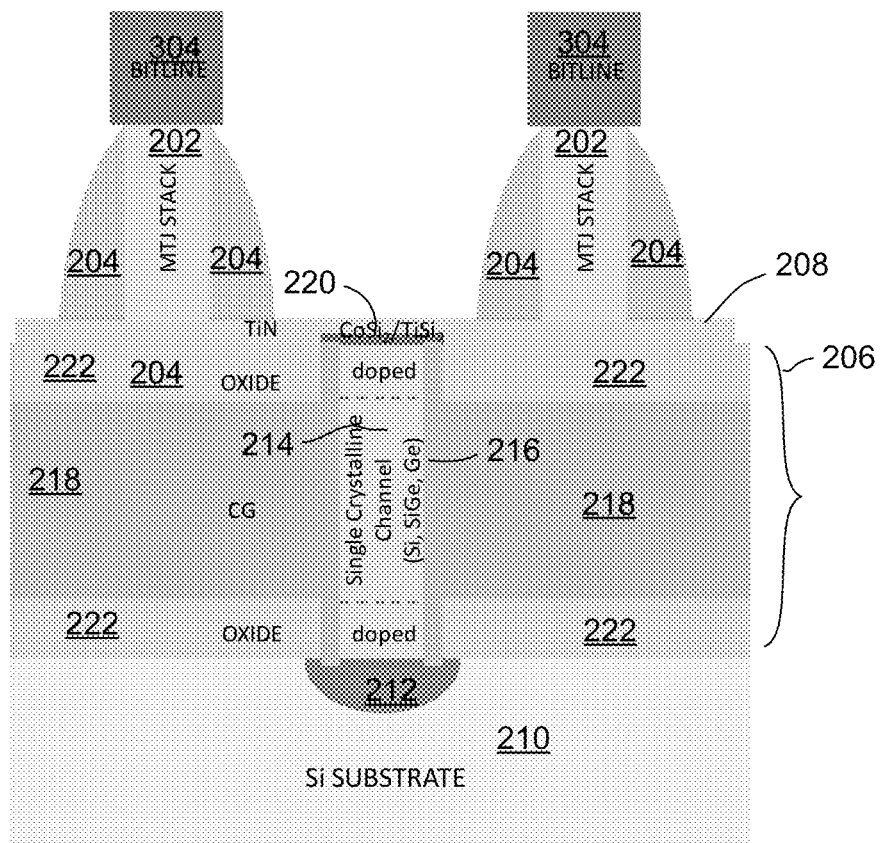
FIG. 3 is a cross-sectional view of a portion of a magnetic memory element array according to another embodiment.

FIG. 3 shows a view of a magnetic memory array 300 according to an alternate embodiment. The magnetic memory array 300 can be similar to the memory array 200 of FIG. 2, except that FIG. 3 shows that the selector structure 206 can be connected with multiple memory elements 202 via electrical connection with the upper contact 208. Each of the memory elements 202 can be electrically connected with a bit line 304. Again, the selector structure 206 includes a semiconductor pillar 214 having a silicide capping layer 220 that provides advantages with regard to the crystallization of the semiconductor pillar structure 214.

Figure 4:
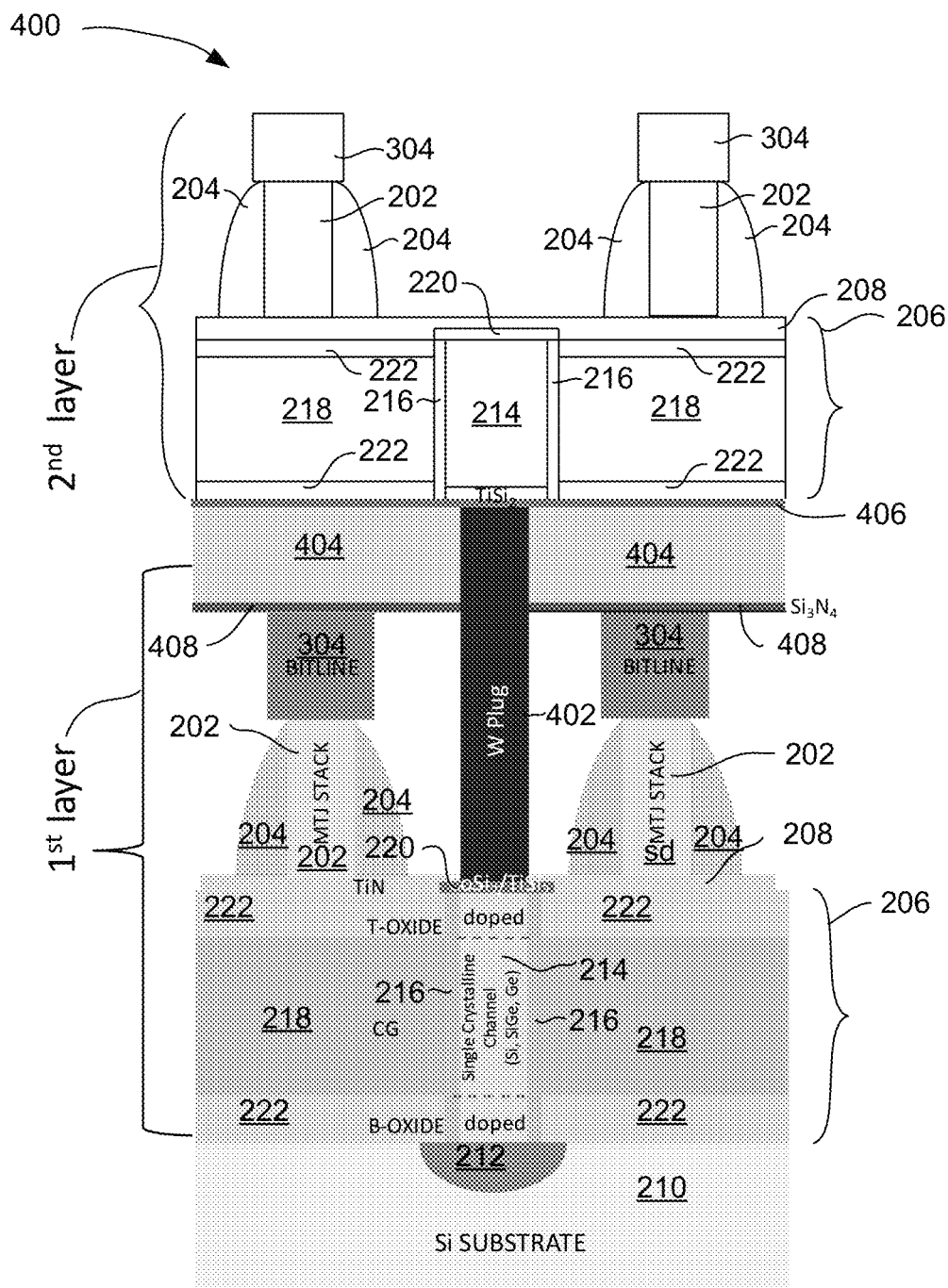
FIG. 4 is a cross-sectional view of a portion of a magnetic memory element array according to another embodiment.

FIG. 4 shows a memory element array 400 according to another embodiment. The memory array 400 is similar to the memory arrays 200, 300 of FIGS. 2 and 3, except that the array 400 shows how the selector structure 206 can be used to select multiple levels of memory elements in a three-dimensional structure. As shown in FIG. 4, a via 402 connects the selector structure 206 with an upper level channel structure. The via 402 can be in the form of a tungsten (W) plug which can extend through and be electrically connected with the channel structure 404. The channel structure 404 can be formed of a semiconductor such as Si or Ge or SiGe.

A barrier layer 408 can be formed over the lower bit lines 304, and an additional dielectric layer 404 can be formed over the barrier layer 408. The barrier layer 408 can be a material such as $Si_3N_4$, and acts to prevent the material of the underlying bit line 304 from adversely affecting over lying semiconductor structures. The dielectric layer 404 can be a material such as $SiO_2$ and provides further isolation between the upper and lower levels of the structure.

A silicide layer 406, such as $TiSi_2$ can be provide over the isolation layer 404 to provide a seed layer for forming a desired crystalline structure in an above deposited semiconductor (e.g. Si) structure 214 formed thereover. The structure of the $2^{nd}$ layer as shown in FIG. 4 can be similar to that of the lower $1^{st}$ structure, having MTJ structures 202 formed over a channel structure 206, wherein a gate 218 applies a gate voltage to the semiconductor structure 214 to selectively apply a current to the MTJ structures 202 in the $2^{nd}$ layer.

In the above embodiments, the use of a silicide capping layer over a semiconductor layer assists with crystallization of the underlying semiconductor material at a lower temperature than would otherwise be possible. This advantageously allows the semiconductor to be deposited as amorphous semiconductor material and then be crystallized either completely or partially at a temperature that is sufficiently low as to not damage the already formed memory elements. This will be better understood with regard to the following discussion of a method for manufacturing magnetic memory structures.

Figure 5:
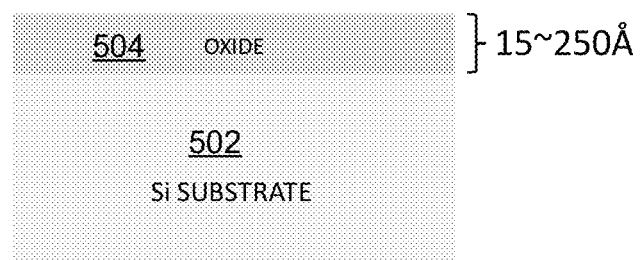
FIGS. 5-20 are views of a memory element array in various intermediate stages of manufacture, illustrating a method of manufacturing a memory element array according to an embodiment.

FIGS. 5-20 show a portion of a magnetic memory element array in various intermediate stages of manufacture in order to illustrate a method of manufacturing a magnetic memory element array according to an embodiment. With reference to FIG. 5, a substrate 502 is provided. The substrate 502 can be a lightly doped semiconductor material such as lightly doped Si. An oxide or nitride layer 504 is deposited over the semiconductor substrate 502. The layer 504 can be, for example $SiO_2$ or $Si_3N_4$ for example 150-250 Angstroms thick.

Figure 6:
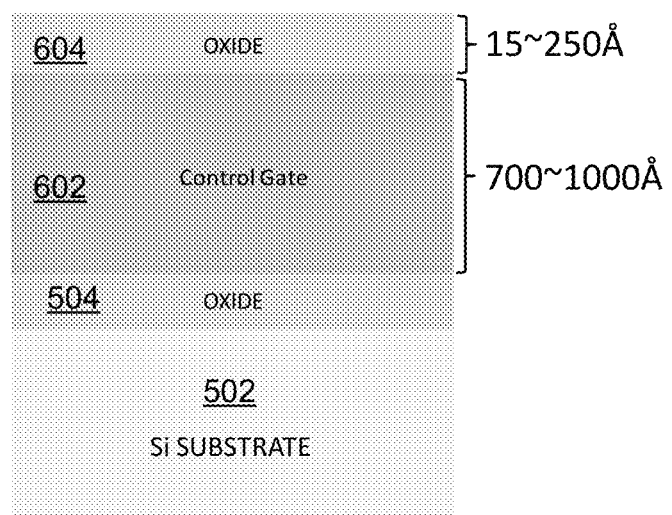

Then, with reference to FIG. 6, a control gate structure 602 is deposited over the layer 504 and a capping layer 604 is deposited over the control gate structure 602. The capping layer 604 can be an oxide or nitride and can be deposited, for example, by HDP, TEOS, PECVD deposition techniques, and in one embodiment an additional layer of $Si_3N_4$ (not shown) can be deposited to facilitate a chemical mechanical polish (CMP) process. The control gate structure 602 can be a poly-silicon and metal such as TiN, W, TaN, etc. and can be, for example, 700 to 1000 Angstroms thick. The oxide or nitride layer 604 can be, for example, 150 to 250 Angstroms thick.

Figure 7:
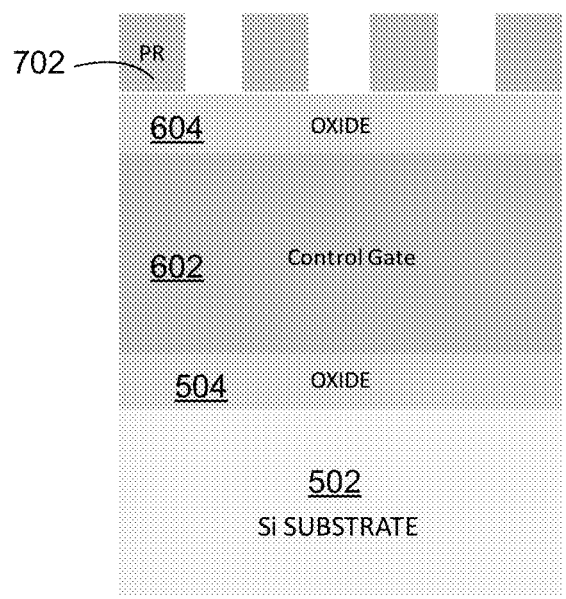
Figure 8:
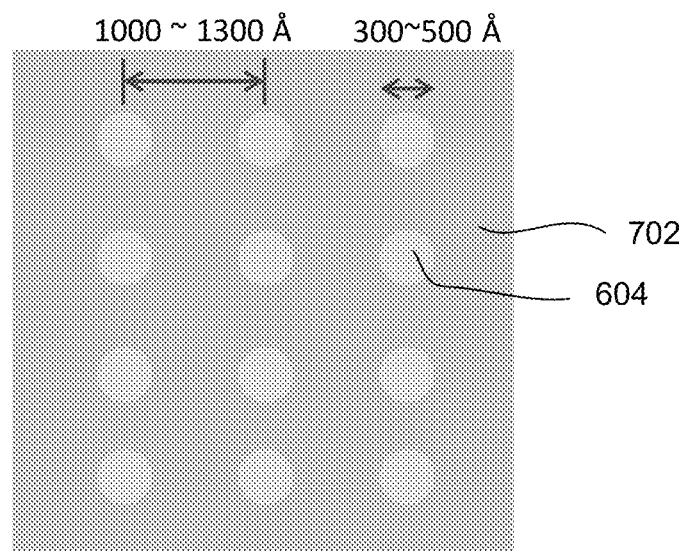

With reference to FIGS. 7, and 8, a mask structure 702 is formed over the capping layer 604. The mask structure 702 can include a photoresist mask and may include other layers as well. The mask 702 can be configured with a plurality of openings which can be seen more clearly with reference to FIG. 8, which shows a top-down view of the structure of FIG. 7. As shown in FIG. 8, in one embodiment, the mask 702 can be formed with openings having a diameter of 300 to 1500 Angstroms which can have a center to center spacing of about 600 to 3000 Angstroms. The oxide layer 604 can be exposed through the openings in the mask 702.

Figure 9:
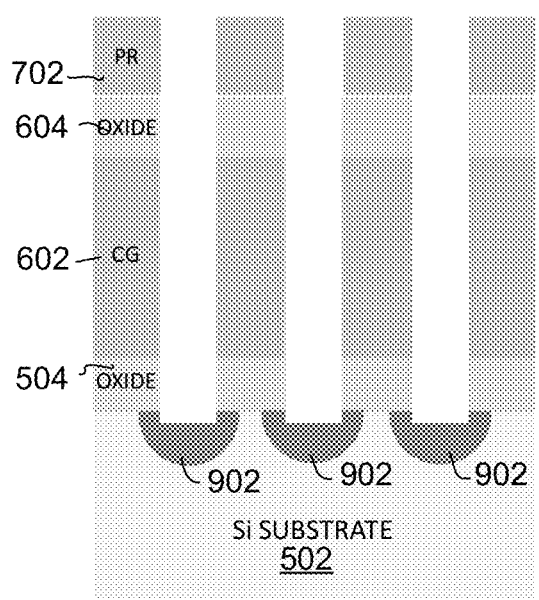

Then, with reference to FIG. 9, a material removal process such as reactive ion etching is performed to remove material not protected by the mask 702. The etching is a deep etching and is performed until the substrate 502 is reached. Preferably the etching is performed using a chemistry so as to selectively remove oxides at a faster rate than semiconductor material (e.g. faster than Si) so as to facilitate stopping the etching at the substrate 502. The portions of the semiconductor 504 exposed through the openings can be doped as desired, leaving doped regions 902. The mask 702 can be removed. This can include performing one or more wet-chemical cleaning and treatment to completely remove organic residue or metal traces such as from hard mask layers.

Figure 10:
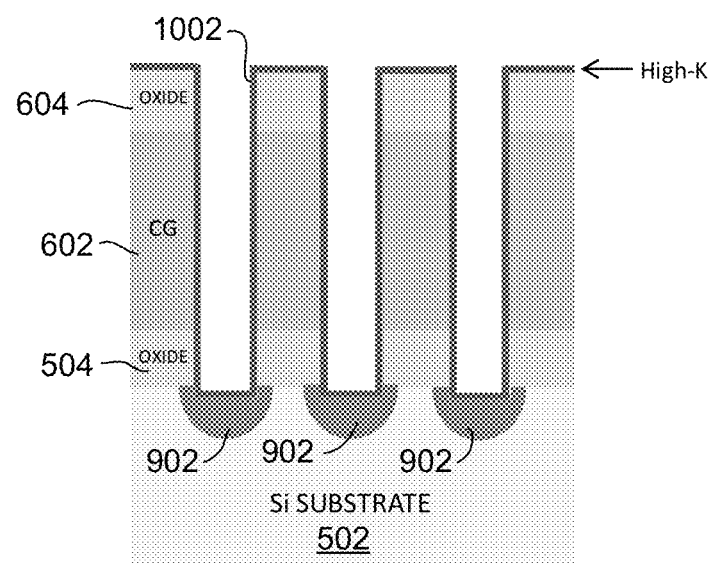
Figure 11:
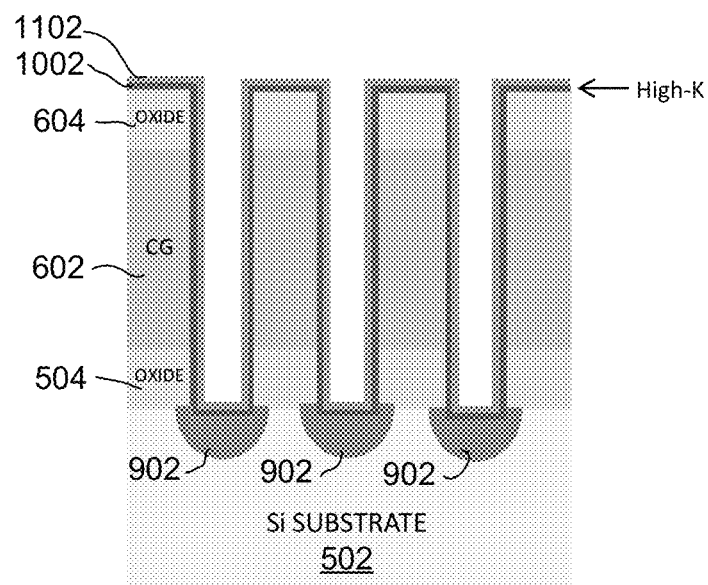

Then, with reference to FIG. 10, a high K dielectric material such as $SiO_2$ 1002 is deposited. The dielectric material 1002 is preferably deposited by a conformal deposition process such as chemical vapor deposition or some suitable conformal deposition process so that it coats the inside of the openings formed in the previous etching process. Then, with reference to FIG. 11, a protective layer 1102 is deposited. The protective layer 1102 can be a material such as amorphous phase silicon (a-Si).

Figure 12:
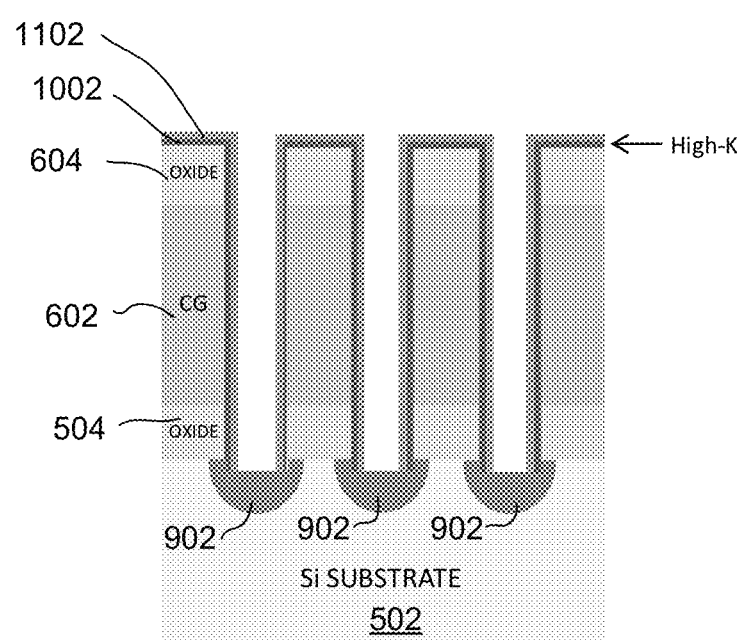
Figure 13:
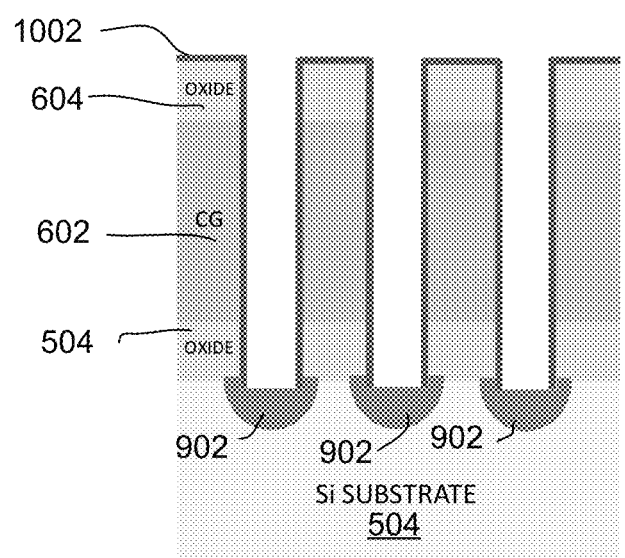

Then, with reference to FIG. 12, an anisotropic etching is performed to expose the doped regions 902 of the substrate 502. The etching is anisotropic in that it preferentially removes horizontally disposed portions of the dielectric layer 1002 and protective layer 1102 while leaving the vertical wall of dielectric material 1002 and protective layer 1102 on the sides of the openings as shown. The protective layer 1102 is then removed and a surface cleaning process is performed, leaving a structure such as that shown in FIG. 13.

Figure 14:
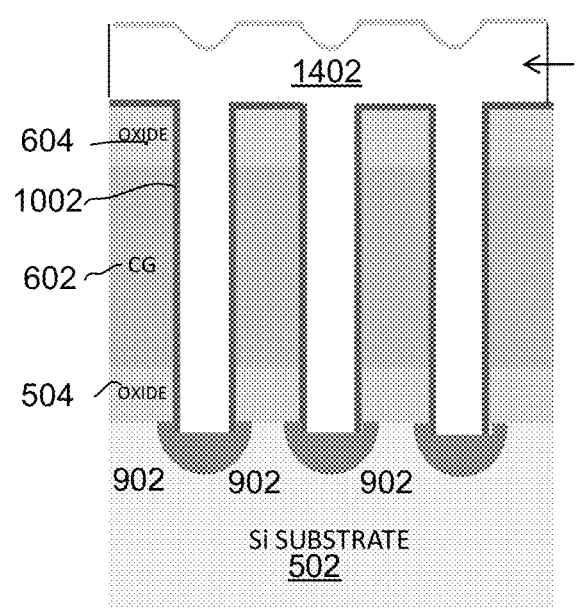

Then, with reference to FIG. 14, an amorphous phase semiconductor (e.g. a-Si, a-SiGe, a-Ge) 1402 is deposited. The amorphous phase semiconductor material can be deposited by Low Pressure Chemical Vapor Deposition (LPCVD) or PECVD. In an embodiment of the process a source and drain junction could be made during this amorphous phase semiconductor deposition process by flowing dopant gas together with the semiconductor.

Figure 15:
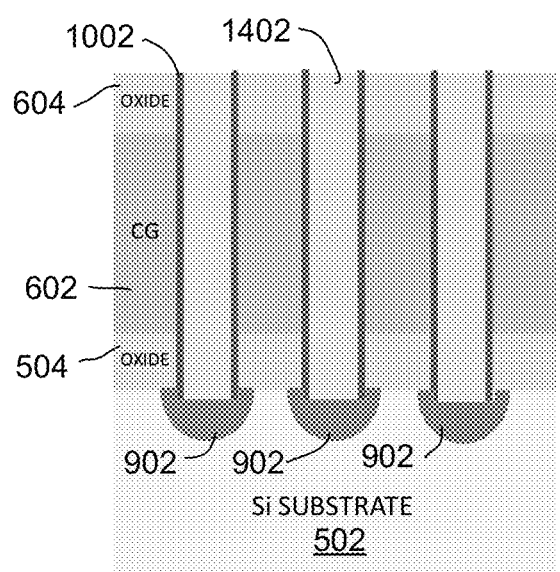

A chemical mechanical polishing (CMP) process can then be performed, leaving a structure as shown in FIG. 15. If source and drain junction was not previously formed, a two-step implantation can be performed to form a source junction and drain junction. Subsequent dopant activation RTA can then be performed.

Figure 16:
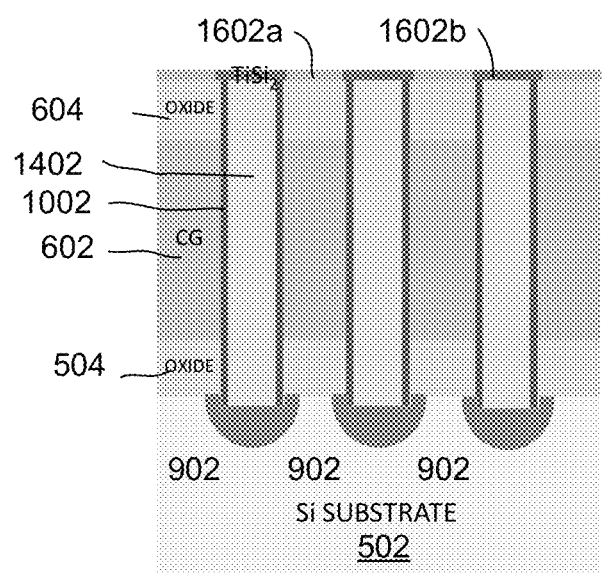

Then, with reference to FIG. 16, a layer of Ti is deposited, and an annealing process is performed. The annealing process forms a $TiSi_2$ capping layer 1602a, and surrounding, remaining Ti 1602b. In addition, the annealing process causes to the amorphous semiconductor to crystallize forming a desired single crystal or poly-crystalline structure. During this silicidation process C49 phase is preferably produced and induces recrystallization of the channel material. It should be pointed out that this annealing process can result in crystallization of the semiconductor 1402 at lower temperature than was previously possible as a result of the $Ti(TiSi_2)$ capping layer 1602. This allows the crystallization to be performed at a temperature that is sufficiently low to avoid damage to any previously constructed memory elements (e.g. MTJ elements). It should be pointed out that, while the silicide capping layer 1602 has been described as Ti ($TiSi_2$), the capping layer 1602 could be formed of other silicides as well, such as $CoSi_2$, NiSi, $NiSi_2$.

Figure 17:
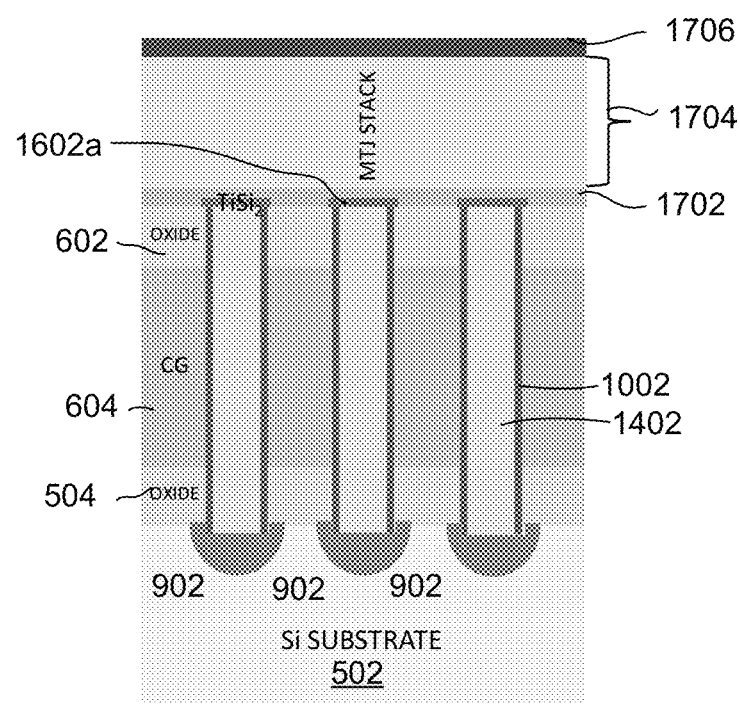

With reference now to FIG. 17, any unreactive Ti is removed leaving $TiSi_2$ capping layers 1602a over the semiconductor channels 1402. A layer of electrically conductive bottom lead material 1702 is deposited (preferably TiN), and a stack of memory element material 1704 (e.g. MTJ layers) is deposited, followed by a hard mask material 1706. The memory element layers 1704 can include back end layers of (TaN), seed layer such as Ta, underlayer such as Ru, synthetic antiferromagnetic (SAF) seed layer, SAF bi-layer PtCo, AFM coupling layer (Ru), SAF bi-layer PtCo, ferromagnetic coupling layer (Mo), reference layer (CoFeB), Tunneling barrier layer (MgO), free magnetic layer (CoFeB), and a capping layer such as Ru. The hard mask layer 1706 can be a material such as TaN.

Figure 18:
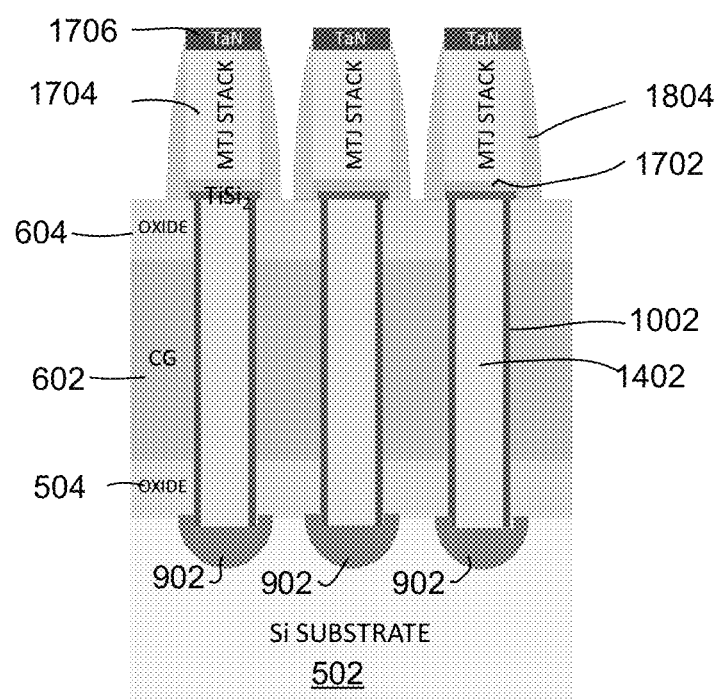
Figure 19:
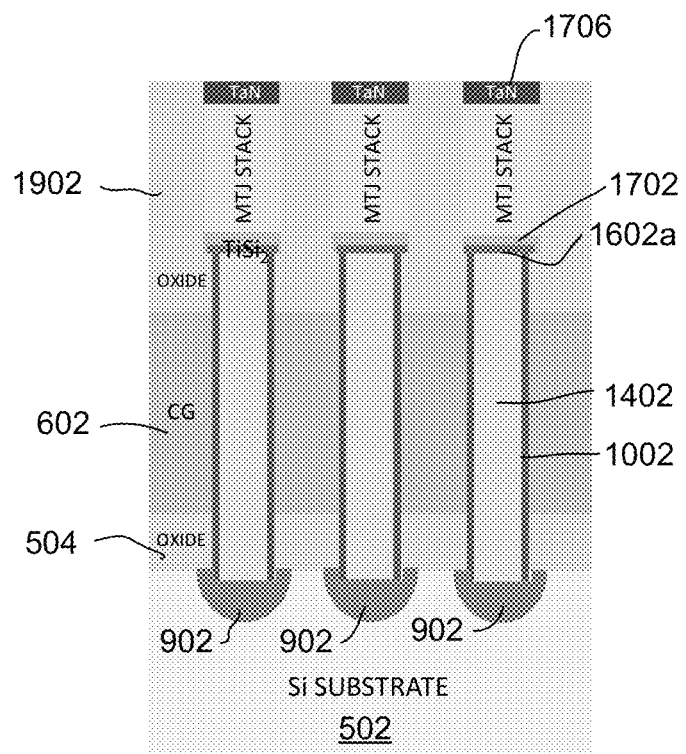

The hard mask 1706 is then patterned such as by photolithography and etching to form a desired mask structure. A Ru capping layer in the memory element stack 1704 can act as a diffusion barrier during the hard mask etching. The photolithographic patterning of the hard mask 1706 can include depositing a photoresist layer (not shown) and photolithographically patterning the photoresist layer. The image of the patterned photoresist mask can then be transferred to the underlying hard mask 1706, such as by an etching process. The photoresist mask can then be removed and a material removal process such as ion milling, ion etching or reactive ion etching can be performed to remove portions of the memory element stack 1704 that are not protected by the mask 1706, thereby forming memory element pillar structures as shown in FIG. 18. A dielectric encapsulation layer 1802 can then be deposited to mitigate sidewall diffusion. Then, a dielectric material 1902 can be deposited and a chemical mechanical polishing process can be performed, leaving a structure such as shown in FIG. 19.

Figure 20:
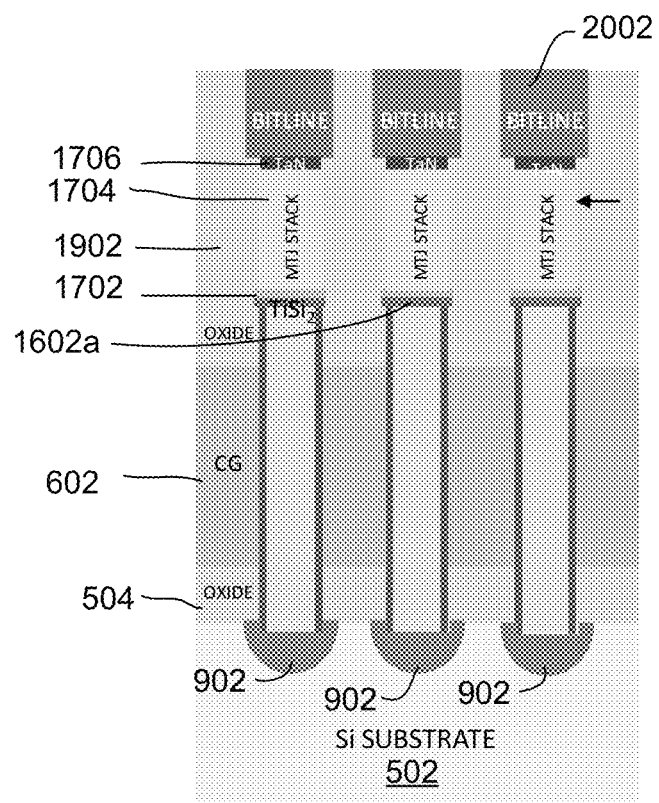

Then, with reference to FIG. 20, one or more bit lines 2002 can be formed so as to be electrically connected with the memory element stack 1704. This process can be, for example, a damascene process that includes depositing a dielectric material, selectively etching the dielectric material to form openings, depositing an electrically conductive metal such as Al or Cu, and then performing a chemical mechanical polishing. However, the bit lines 2002 could be formed by other processes as well.

Figure 21:
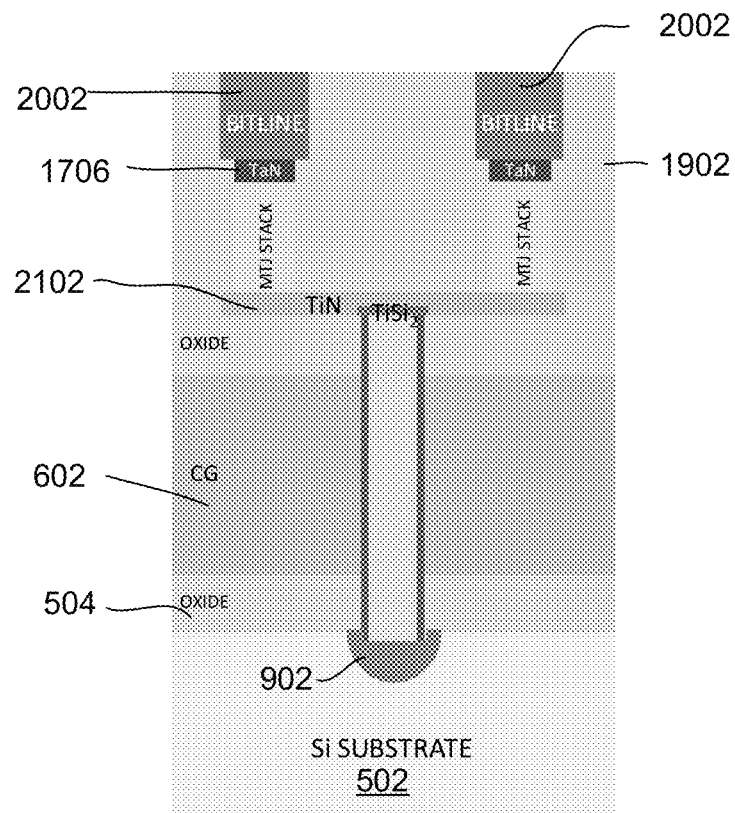
FIGS. 21-34 are views of a memory element array in various intermediate stages of manufacture, illustrating a method of manufacturing a memory element array according to an alternate embodiment.
Figure 22:
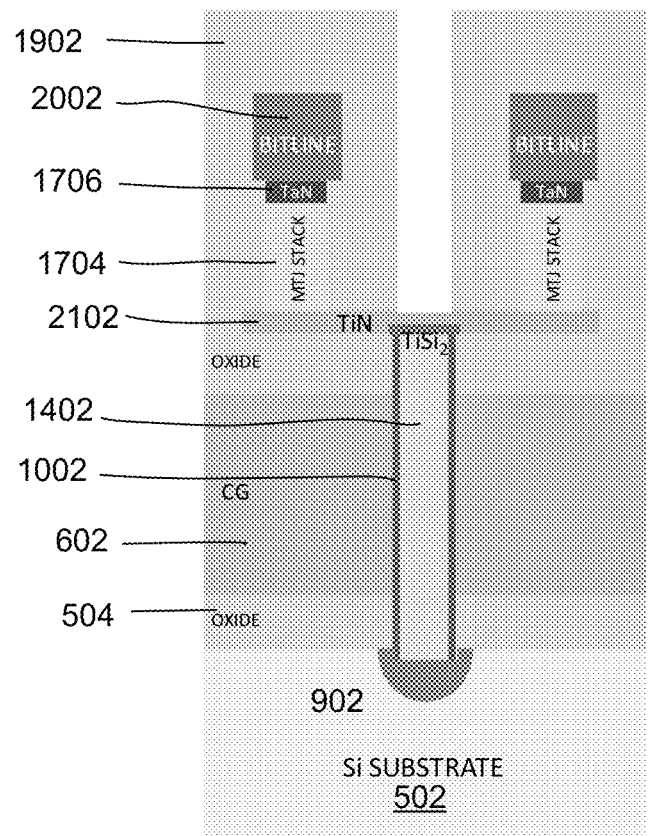
Figure 23:
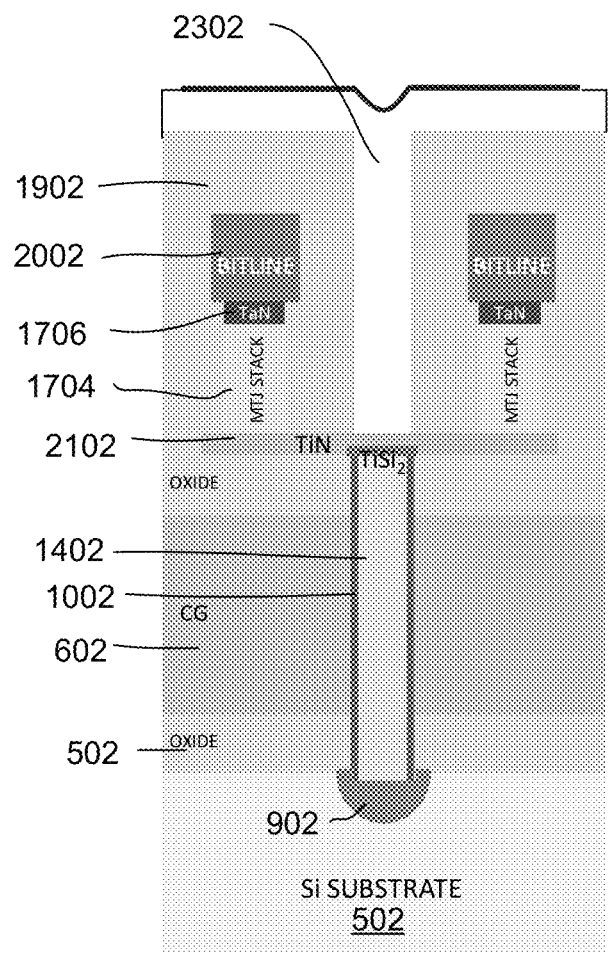
Figure 24:
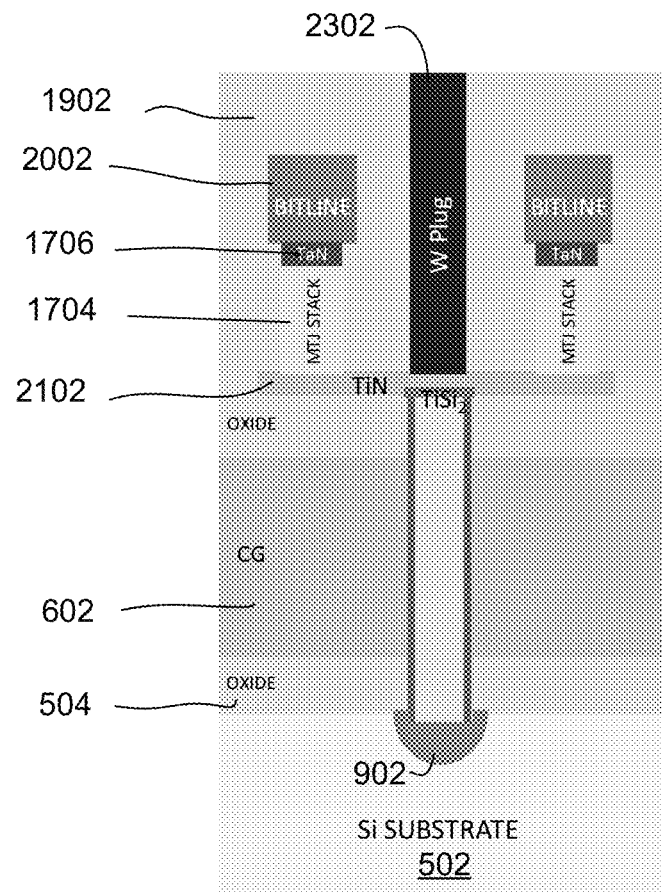
Figure 25:
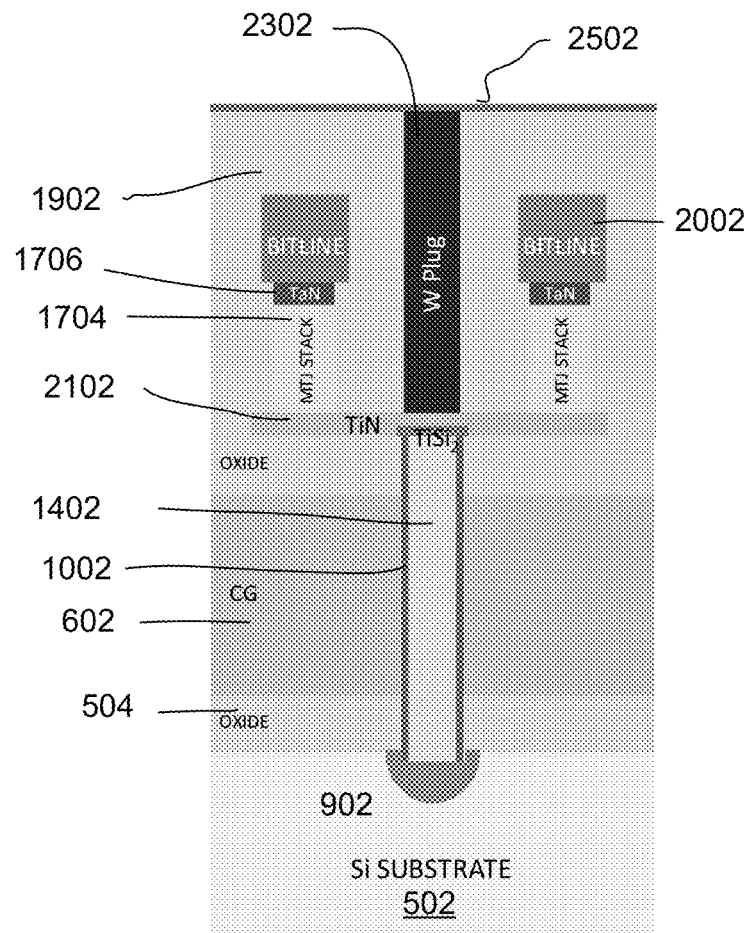

FIGS. 21-34 show a magnetic memory array in various intermediate stages of manufacture in order to illustrate a method of manufacturing a multi-level memory array. FIG. 21, shows an embodiment, wherein a single lead layer 2102 connects more than one memory element 1704. With reference to FIG. 22, additional oxide 1902 is deposited and an opening is formed into the dielectric 1902 so that the opening extends to the lead 2102. With reference to FIG. 23, an electrically conductive material 2302 such as tungsten W is deposited, and then a chemical mechanical polishing process is performed, leaving a structure such as that shown in FIG. 24. Then, with reference to FIG. 25, a second silicide layer such as $TiSi_2CoSi_2$, or NiSi 2502 is formed or deposited, and a second layer of memory elements can be then formed thereover. The silicide layer 2502 provides a crystalline phase seed layer for formation of a second level semiconductor channel to be formed over the structure shown in FIG. 25.

Figure 26:
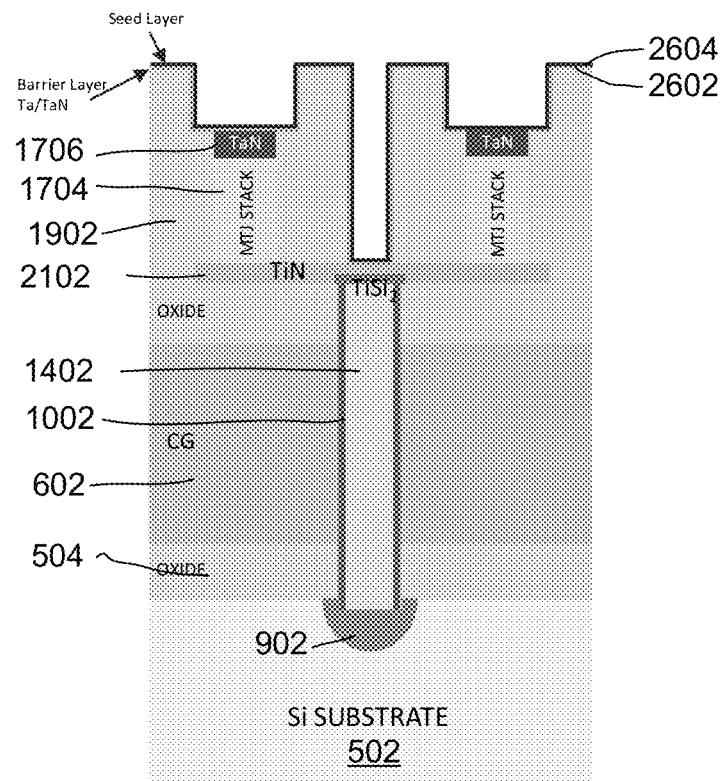
Figure 27:
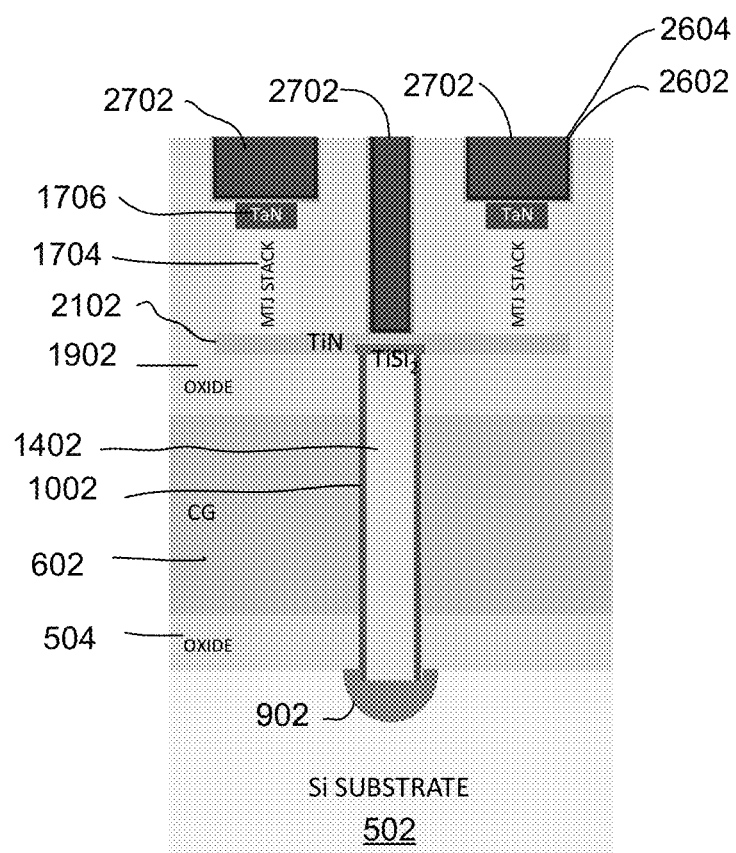

FIGS. 26-29 show an example of a method for forming bit lines. As shown in FIG. 26, openings are formed for the via and also for the location of bit lines. A barrier layer 2602 such as TaN, TiN or $Si_3N_4$ is deposited followed by an optional electrically conductive seed layer 2604. The seed layer 2604 may be used as an electroplating seed if the barrier layer 2602 is a non-conductive material such as $Si_3N_4$, but may not be needed if the barrier layer 2602 is a conductive material such as TaN or TiN. An electrically conductive metal such as Cu 2702 is electroplated, followed by a chemical mechanical polishing process, leaving as structure such as shown in FIG. 27.

Figure 28:
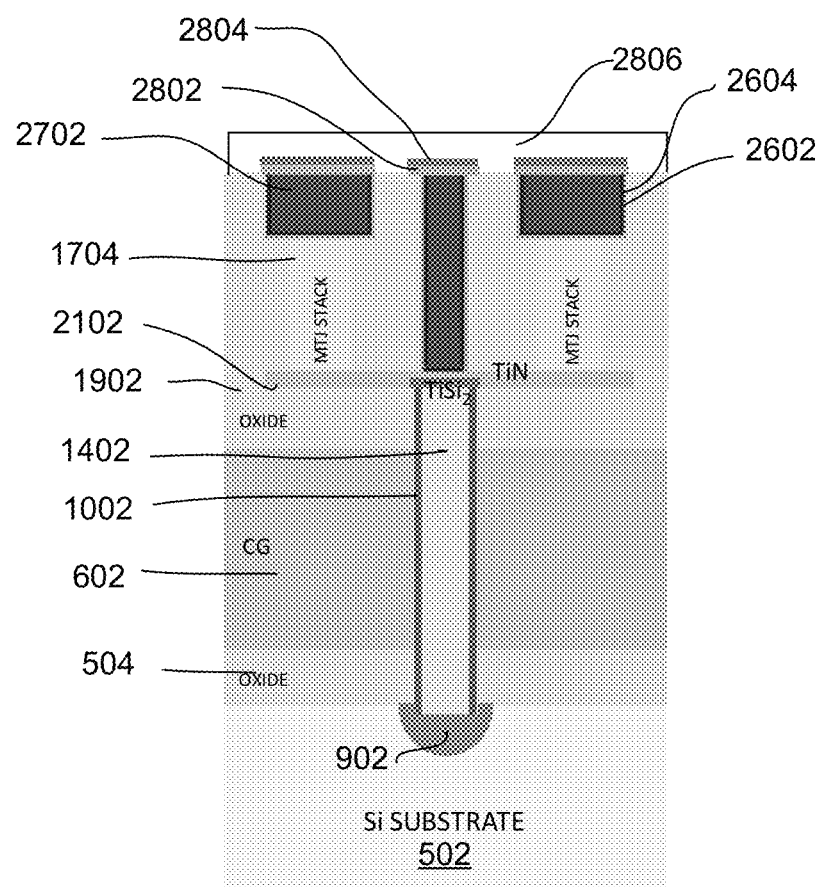

With reference to FIG. 28, an upper barrier layer 2802 is deposited followed by a layer of silicide such as $TiSi_2$ 2804. These layers 2802, 2804 are patterned as shown in FIG. 28. In this embodiment, the barrier layer 2802 can be an electrically conductive material such as TaN or TiN. In this case, the barrier layer 2802 and silicide layer 2804 can be deposited together and then patterned to leave these materials 2802, 2804 only in desired regions over the electrically conductive structures 2702 so as to prevent current shunting between these structures.

Figure 29:
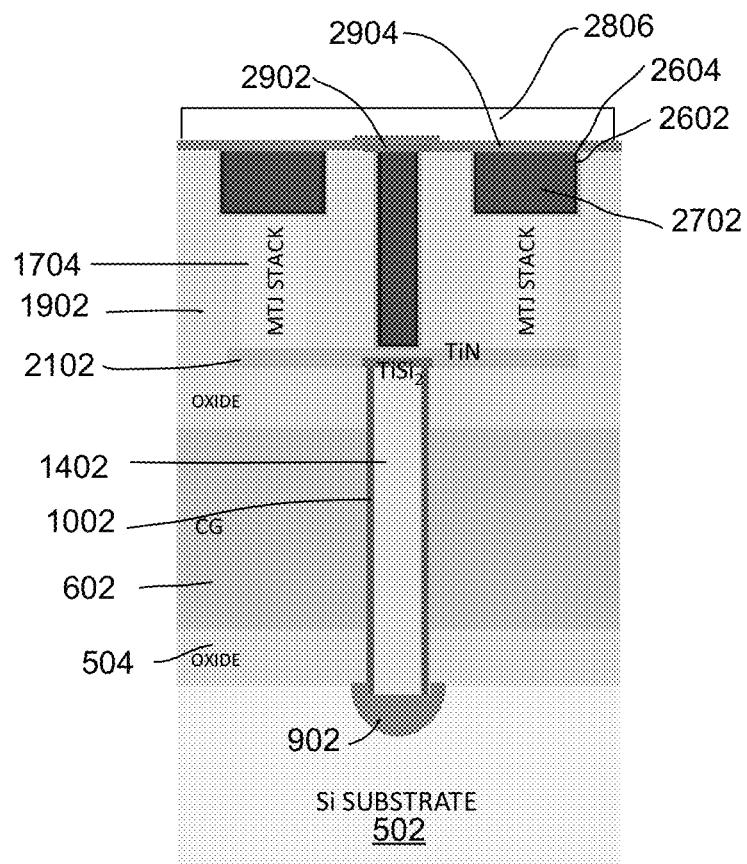
Figure 30A:
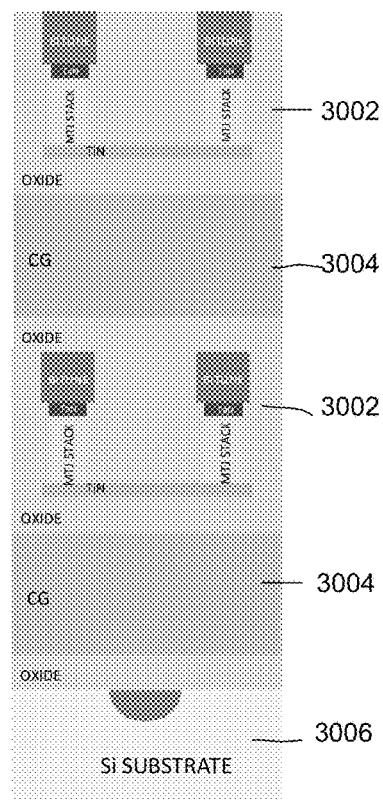
Figure 30B:
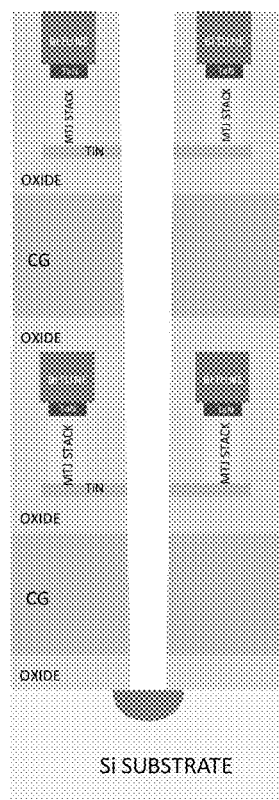
Figure 30C:
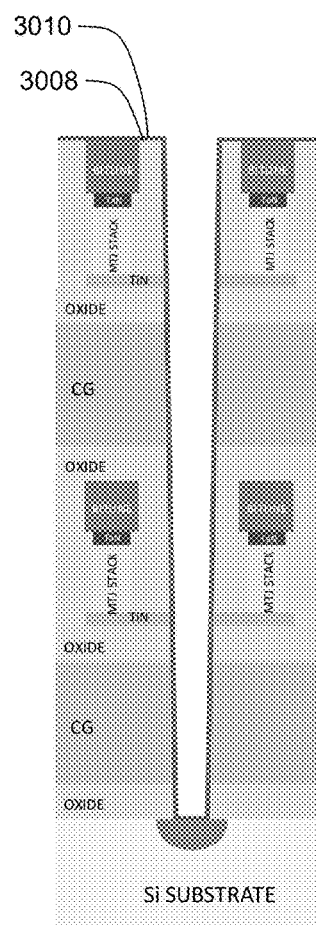
Figure 31A:
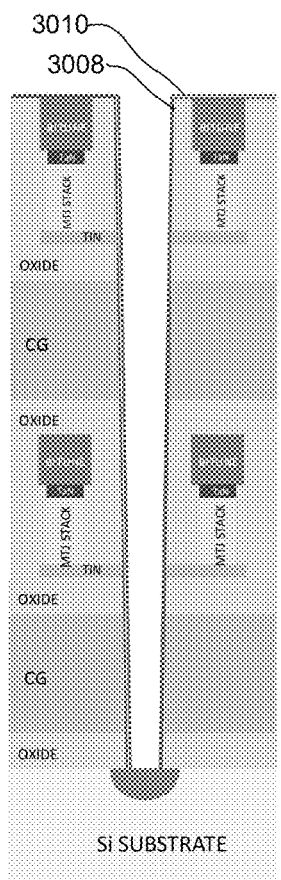
Figure 31B:
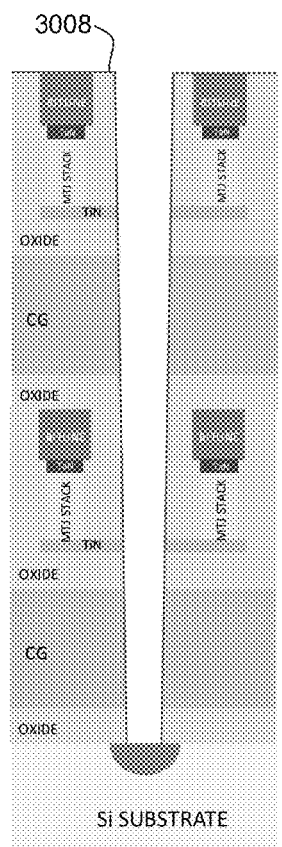
Figure 31C:
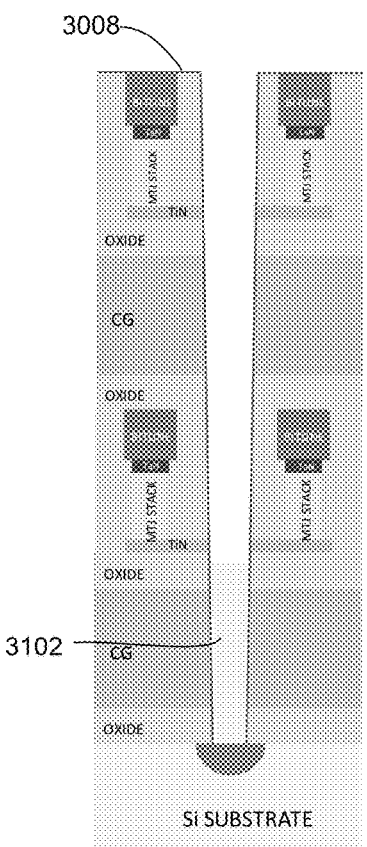

Alternatively, as shown in FIG. 29, a silicide structure 2902 is formed, and an electrically insulating barrier layer 2904 such as $Si_3N_4$ is deposited. In this case, because the barrier layer 2904 does not need to be patterned, because it will not lead to current shunting.

FIGS. 30-34 illustrate a method for manufacturing a multi-layer magnetic memory array. In FIG. 30a a series of memory element levels 3002 and control gates 3004 are formed over a substrate 3006. A masking and etching are performed to form an opening in the memory element layers 3002 and control gates 3004, stopping at the substrate 3006, as shown in FIG. 30b. Then, a dielectric 3008 is deposited followed by a protective layer 3010 as shown in FIG. 30c. Then, an anisotropic etching is performed to remove the dielectric 3008 and protective layer 3010 from the bottom of the opening as shown in FIG. 31a. The protective layer 3008 is removed, leaving a structure as shown in FIG. 31b. Then, an amorphous silicon (a-Si) 3102 is deposited into the opening. In one embodiment, the amorphous silicon 3102 can be deposited by thin film deposition techniques. In this case, the amorphous silicon 3102 would be deposited also in areas outside of the openings. An etch back process can then be performed to remove the unwanted amorphous silicon from these regions outside of the openings.

Figure 32A:
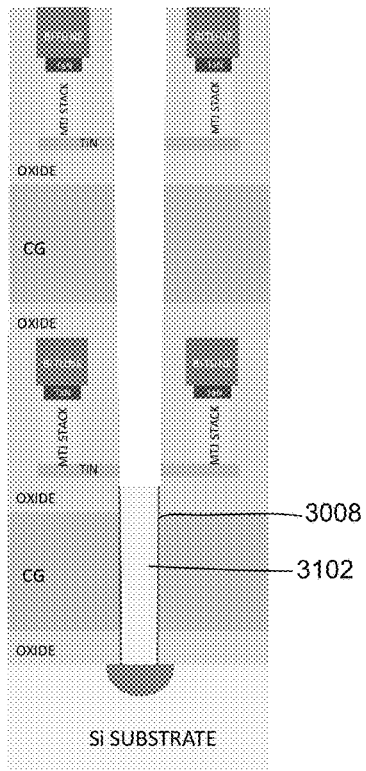
Figure 32B:
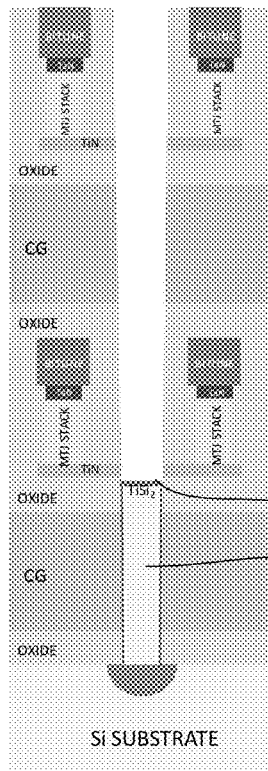
Figure 32C:
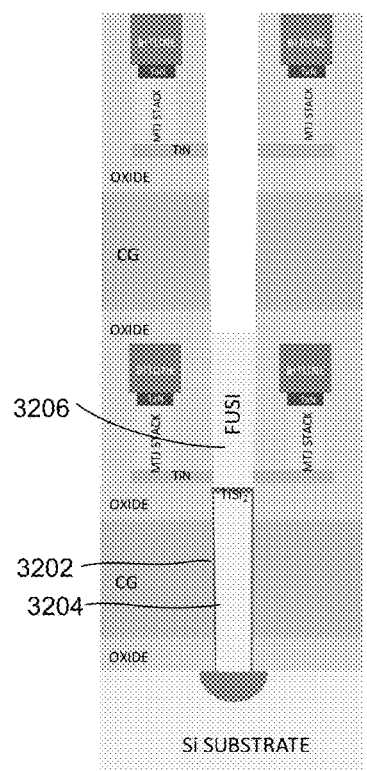
Figure 33:
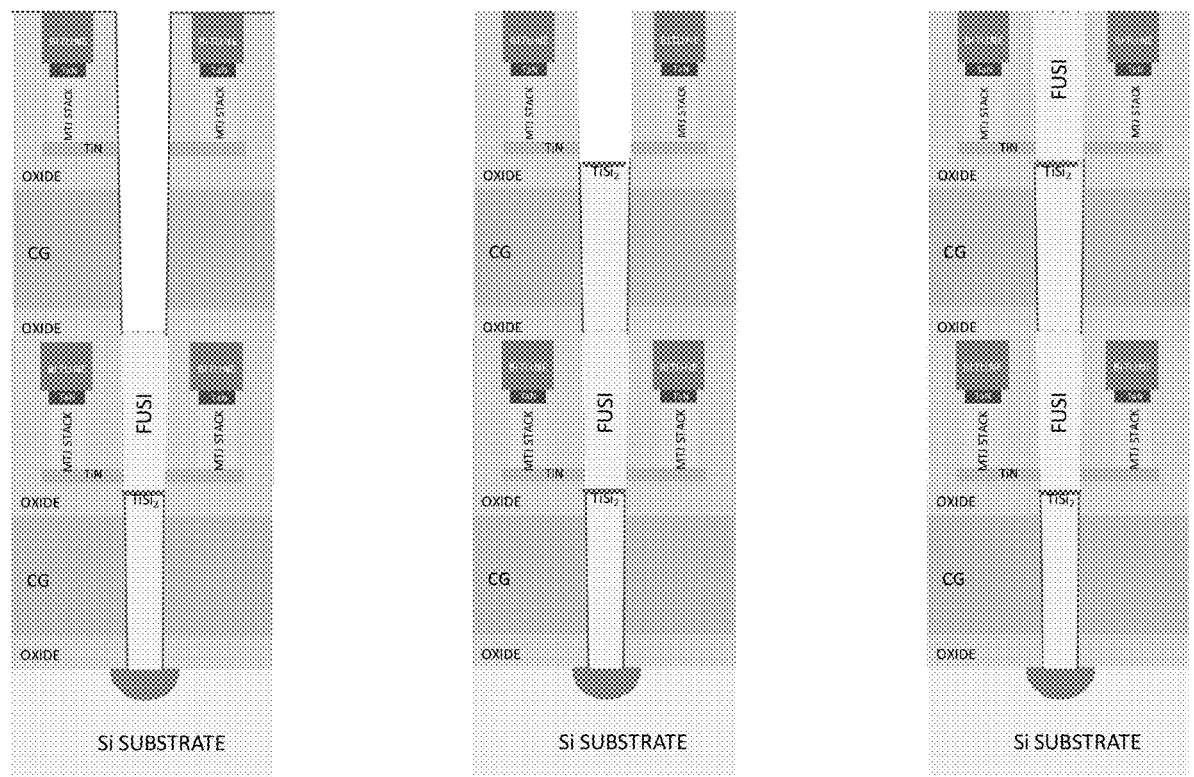
Figure 34:
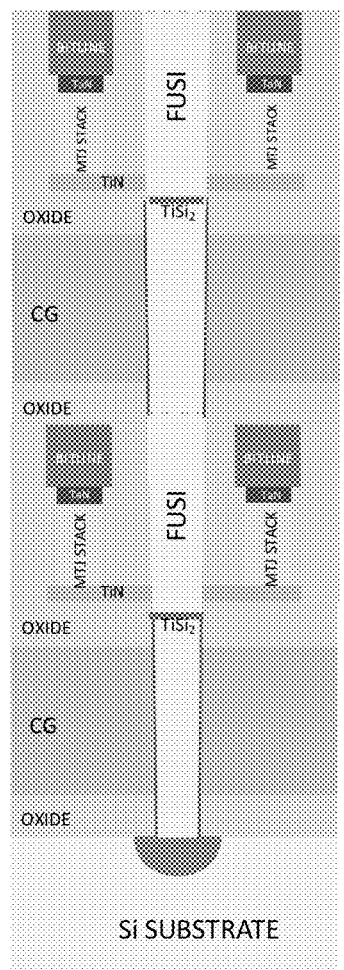

A low temperature silicon epitaxy or LPCVD (Low Pressure CVD) a-Si and recess process is then performed leaving a structure as shown in FIG. 32a. As can be seen, the dielectric material 3008 above the silicon 3102 is removed. Then, Ti is deposited followed by silicidation and removal of unreacted Ti, leaving a structure as shown in FIG. 32, with a $TiSi_2$ capping layer 3202 over crystallized silicon 3204. It should be pointed out as well that $TiSi_2$ is by way of example, as other silicides could be used. Then, with reference to FIG. 32c, a fully silicided silicon (FUSI) 3206 is formed. In one embodiment, a fully silicided silicon layer is prepared by a-Si deposition, recession of a-Si by blanket etch, Ni deposition and silicidation process, and subsequent removal of unreacted Ni. In another embodiment, a fully silicided silicon (FUSI) is prepared by low temperature epitaxial silicon growth, Ni deposition and silicidation process, and subsequent removal of unreacted Ni. An optional sidewall protection layer may also be deposited before the FUSI layer 3206. The removal of the dielectric material 3008 above the amorphous silicon 3204 allows good electrical contact with the silicide layer 3202 and FUSI 3206, both of which are highly electrically conductive.

These processes are repeatedly performed as shown in FIGS. 33a, 33b, 33c, 34 to form multiple layers of crystallized Si with $TiSi_2$ capping layers and FUSI layers to connect the multiple layers of memory element arrays.

In addition to forming a semiconductor transistor by amorphous deposition and annealing as disclosed above, the semiconductor can also be formed by epitaxial growth on a suitable crystalline semiconductor substrate. This epitaxial growth would not be obvious to one skilled in the art of semiconductor transistor fabrication because of the unique requirements of transistor structures used in a three-dimensional memory array such as described above and further described herein below.

Figure 35:
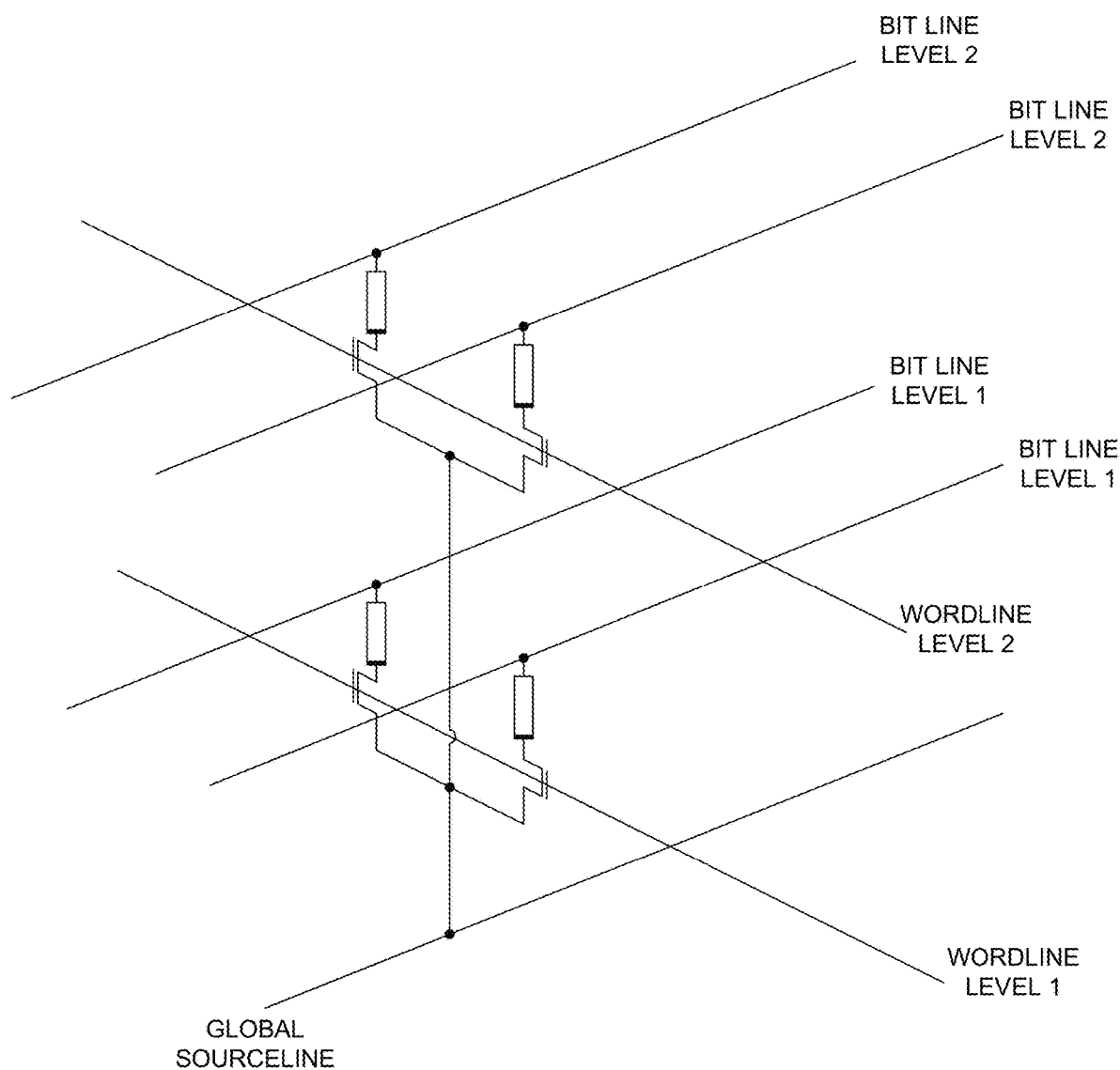
FIG. 35 is a schematic illustration of a portion of a magnetic memory array.

FIG. 35 shows a schematic view of a three-dimensional magnetic memory array 3500. The array 3500 includes a source line 3502 that is electrically connected with a plurality of three-dimensional pillar structures. Each of the three-dimensional pillar structures includes a plurality of magnetic tunnel junction memory elements 3504 that may each be connected with one or more of a word line 3506 and bit line 3508. In addition, each three-dimensional pillar structure is associated with at least one transistor structure 3510 that connects the plurality of magnetic tunnel junction memory elements 350 with the source-line 3502. The transistors 3510 can selectively connect the memory elements 3506 with the source-line 3502 to selectively apply a write current to a desired memory element 3506. If the sourceline 3502 becomes heavily capacitive and resistive due to its 3-dimensional structure, another source select electrode and source select transistor could be integrated in order to reduce the burden of source line loading.

Figure 36:
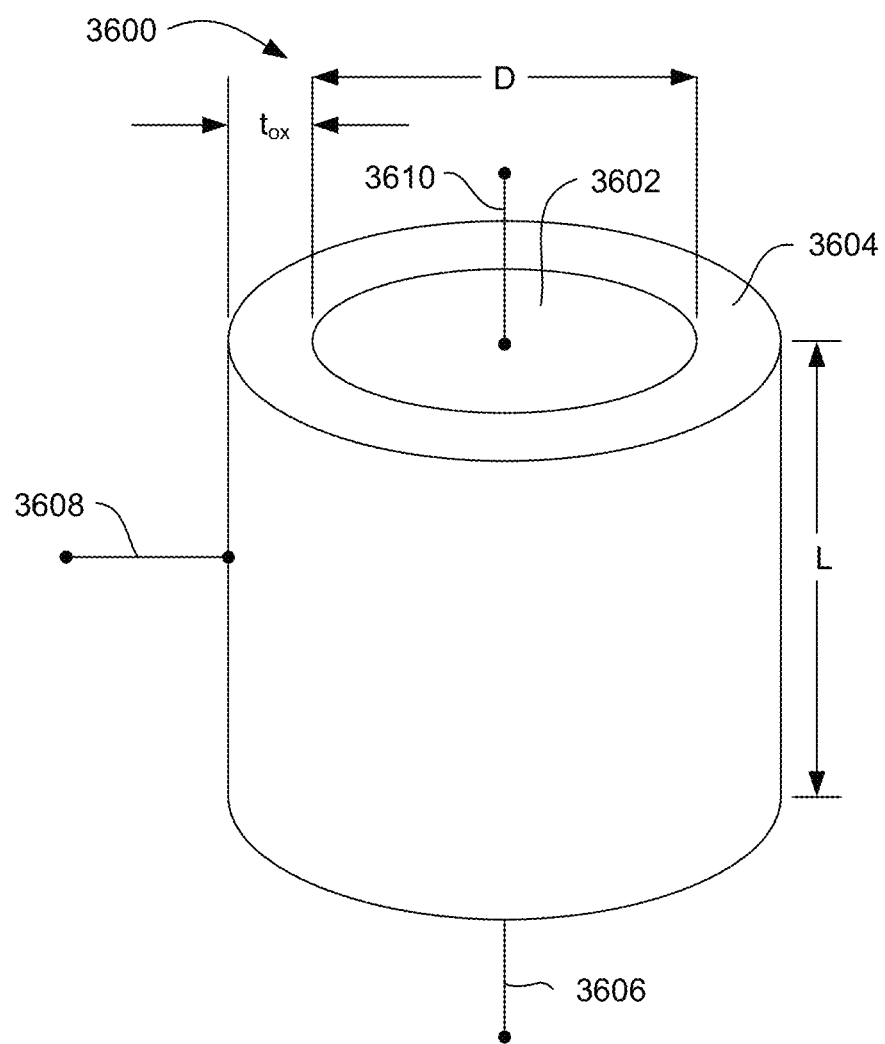
FIG. 36 is a schematic illustrations of a transistor structure.

FIG. 36 shows a schematic view of a three-dimensional pillar type transistor structure 3602 such as might be used as a transistor 3508 of FIG. 35. The transistor structure 3600 includes a semiconductor pillar 3602 that is constructed of a crystalline semiconductor material such as Si. A gate dielectric layer 3604 is formed at the sides of the silicon pillar 3602, surrounding and contacting the semiconductor pillar. The gate dielectric layer 3604 can be formed of a dielectric material such as silicon dioxide. A source line 3606 can be electrically connected with an end of the silicon pillar 3602, and a gate line 3608 can be electrically connected with the gate dielectric layer 3604. A drain line 3610 can be connected with a bottom electrode of an MTJ memory element (not shown).

For use in a magnetic memory array such as those described above, the transistor 3600 is preferably designed to handle high electrical currents. Therefore, it is desirable that certain dimensional ratios be maintained. As can be seen in FIG. 36, the semiconductor pillar has a diameter D. The gate dielectric (oxide) has a thickness $t_{ox}$, and the semiconductor pillar 3602 and gate dielectric layer 3604 have a length L. The transistor 3600 is basically "electrical switch" controlled by voltage on the gate electrode. A channel (where electrons flows when transistor is in an on-state) is formed where the gate electrode 3608 touches semiconductor channel through gate dielectric. In the 3D channel, gate material is surrounding vertical channel. Therefore, effective channel width could be calculated by "2*pi*D" in the vertical channel. Whereas channel width would have been just "D" in the planar channel case of a standard semiconductor transistor with a same silicon floor. Since a larger channel proportionately deliver more currents, the vertical transistor 3600 has the potential to delivered high require current for switching of MTJ cell and to be scaled with regard to size. This facilitates high density memory integration.

In order to have a high performance transistor, a clean material system (such as well-ordered crystalline silicon channel material by epitaxial growth has intrinsically better mobility of electro-channels as electron see less scattering events as they pass through channel under gate dielectric/material) and well-designed source/drain junction is required. In an embodiment, a source/drain junction will be formed with in-situ doping or out-diffusion or implantation either as silicon channel is being deposited by PECVD, PVD or after channel has been deposited.

While much of the discussion above focused on the deposition of amorphous semiconductor material and later deposition, as mentioned above, the transistor structure can also be formed by epitaxial semiconductor growth. One way in which this can be achieved is to perform a silicidation process before deposition of semiconductor material.

Figure 37:
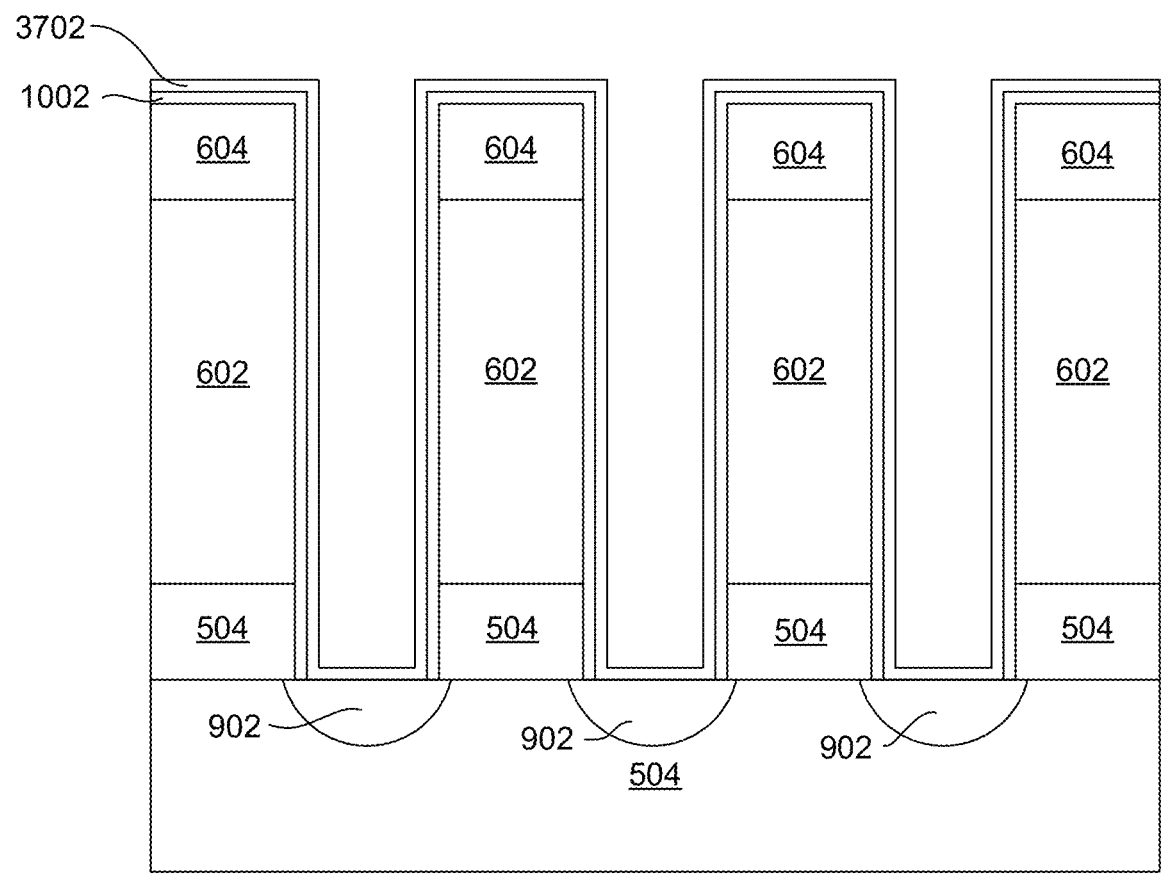
FIGS. 37-42 show a magnetic memory array in various intermediate stages of manufacture in order to illustrate a method for manufacturing a magnetic memory array according to an alternate embodiment of the invention.
Figure 38:
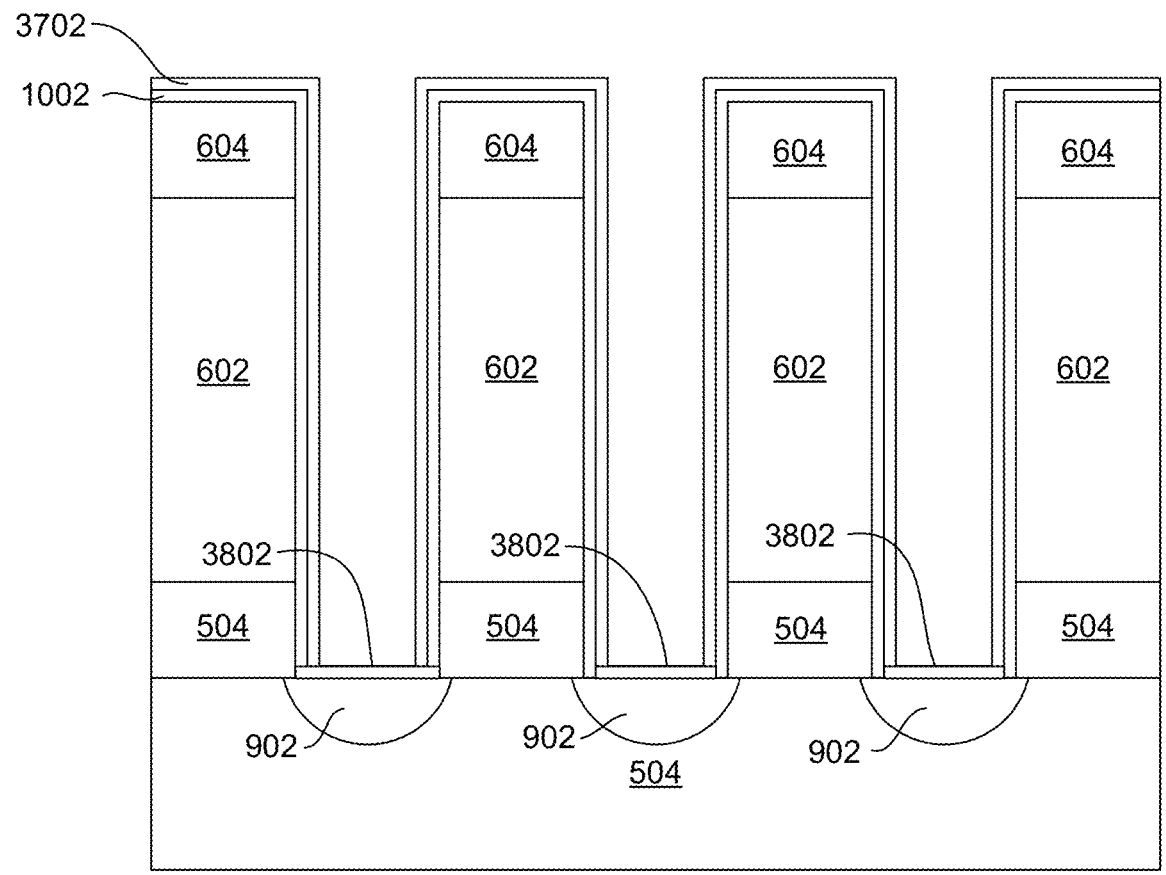

Such a process for forming a transistor structure using epitaxial semiconductor growth is illustrated with reference to FIGS. 37-42. FIG. 37 shows a structure similar to that described with reference to FIG. 13. A silicide-forming metal 3702, such as Ni, Ti or Co, is deposited. Then, with reference to FIG. 38, an annealing process is performed to form specific desired phases of target silicide 3802 at the bottom region in contact with the doped semiconductor portion 902 of the substrate 504. This process leaves the unreacted metal 3702 at the sides and top of the structure as shown in FIG. 38. This unreacted metal portion 3702 can then be removed after formation of the silicide 3802.

Figure 39:
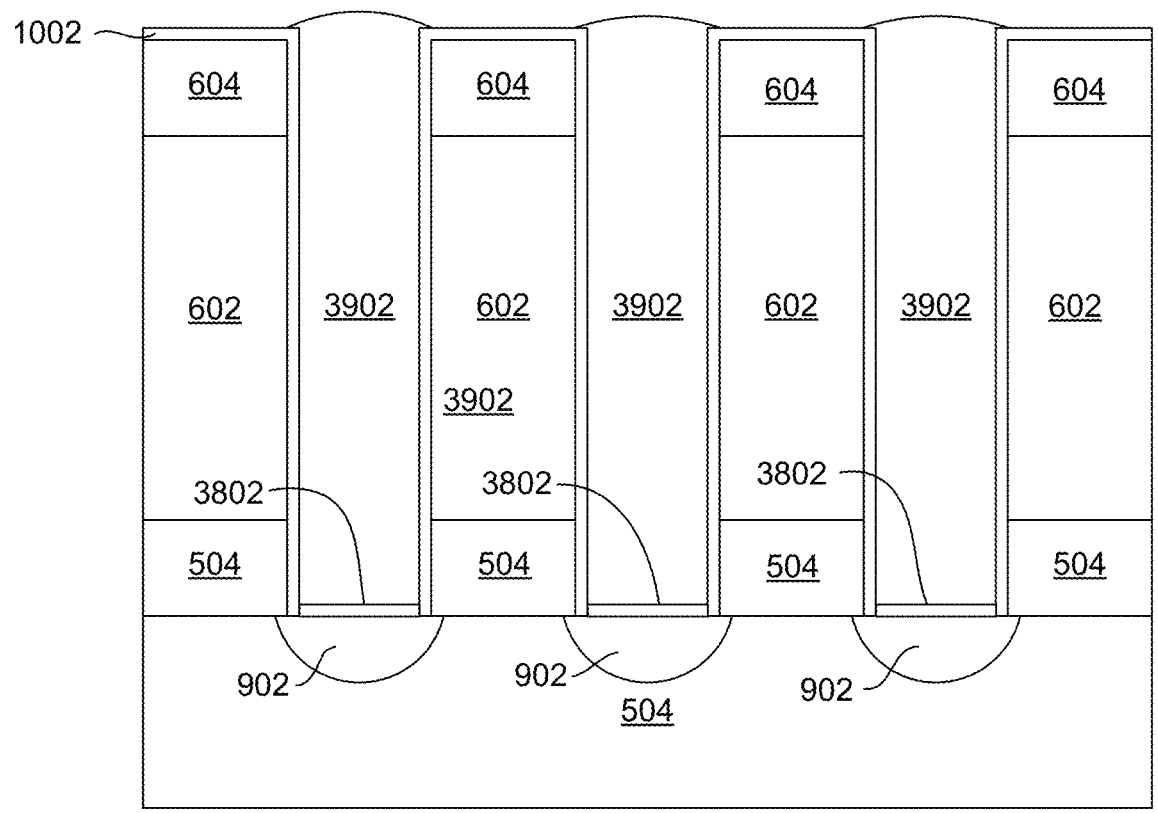

With reference now to FIG. 39, a semiconductor material 3902 is epitaxially grown on the silicide layer 3802. More particularly, this process can include first performing a surface cleaning and then depositing the semiconductor material 3902 (e.g. silicon), while fostering epitaxial growth (with varying degrees of crystallinity depending upon deposition condition) along the vertical direction.

Figure 40:
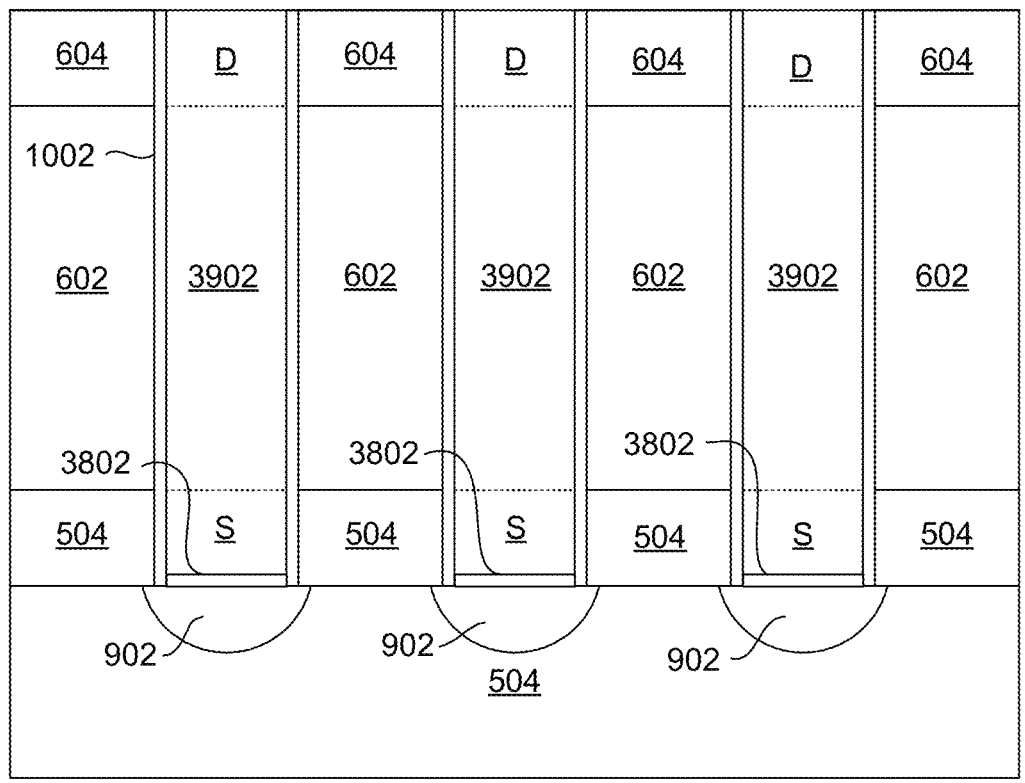

A chemical mechanical polishing process can then be performed, leaving a structure as shown in FIG. 40. A source region S of the semiconductor 3902 can be formed in-situ at the bottom of the deposited semiconductor material 3902. A drain region D of the semiconductor 3902 could be formed during deposition of the semiconductor 3902 or could be formed by implantation after the chemical mechanical polishing has been performed.

Figure 41:
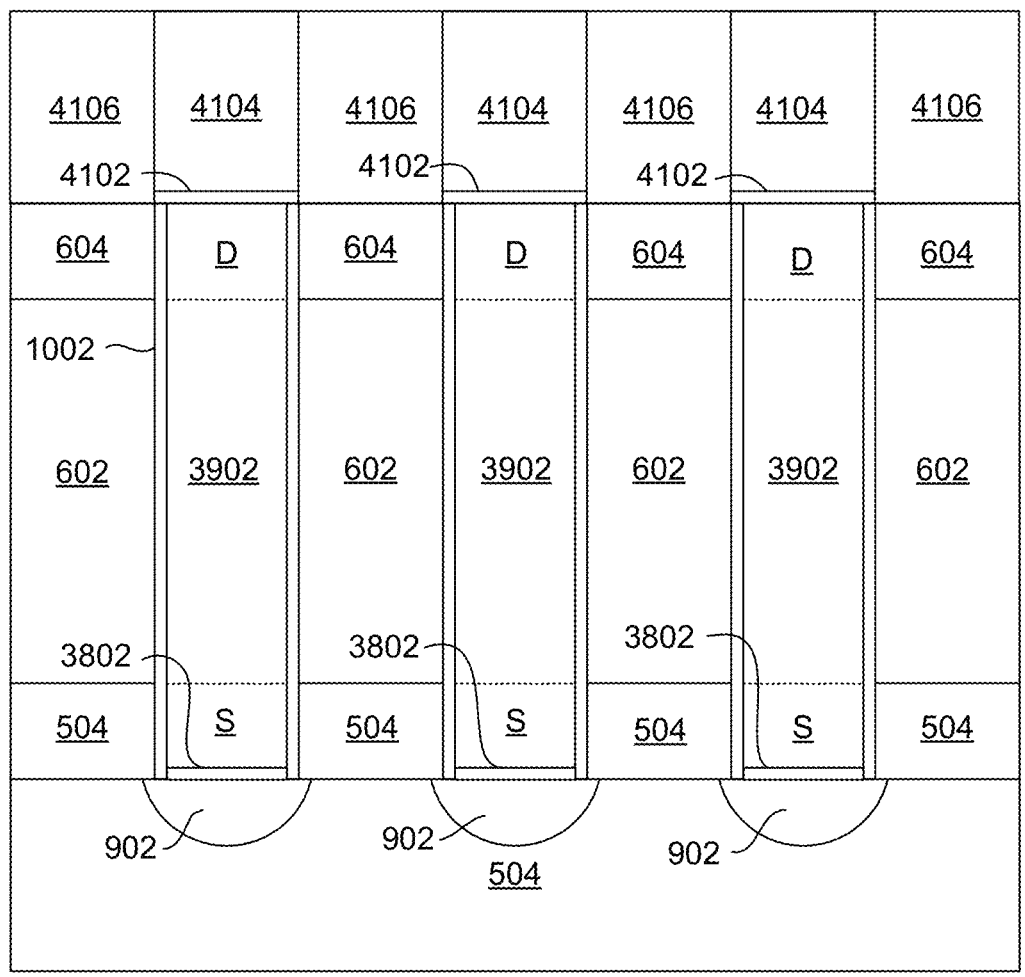
Figure 42:
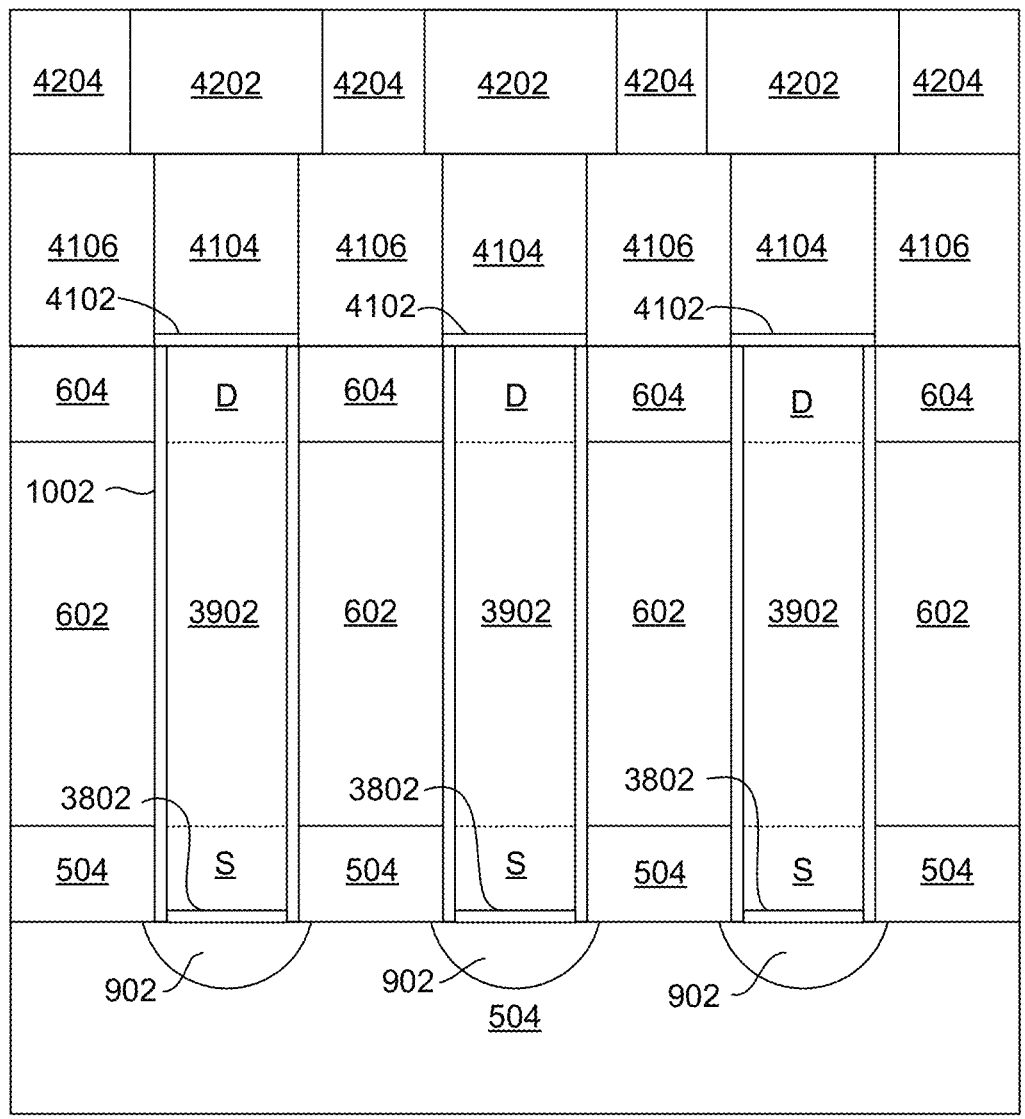

With reference to FIG. 41, a layer 4102 can be deposited over the semiconductor 3902 and a magnetic tunnel junction memory element 4104 can be formed over the layer 4102. The layer 4102 can be a layer of TaN, or can be a layer of silicide formed by a silicidation process. A non-magnetic, dielectric isolation layer 4106 can be formed between the magnetic tunnel junction memory elements 4104. Then, with reference to FIG. 42, a series of electrically conductive bit lines 4202 can be formed over the magnetic tunnel junction memory elements 4104. The bit lines 4202 can be separated from one another by electrically insulating layers 4204.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic memory array, comprising:
   a substrate;
   a control gate structure formed over the substrate;
   a semiconductor pillar structure adjacent to the control gate;
   a silicide capping layer formed over and in contact with the semiconductor pillar structure; and
   a magnetic element formed over the capping layer;
   wherein at least a portion of the semiconductor pillar structure is monocrystalline semiconductor.

2. The magnetic memory array as in claim 1, wherein the silicide capping layer comprises one or more of $CoSi_2$, $TiSi_2$, or $NiS_2$.

3. The magnetic memory array as in claim 1, further comprising a silicide seed layer, wherein the semiconductor structure is formed on the silicide seed layer.

4. The magnetic memory array as in claim 3, wherein the silicide seed layer comprises one or more of $TiSi_2$ (210) (1.7%), $CoSi_2$ (1.2%) or $NiSi_2$ (0.4%).

5. The magnetic memory array as in claim 1, wherein the semiconductor structure is cylindrical having first and second ends and an outer side that extends between the first and second ends.

6. The magnetic memory array as in claim 5, wherein the gate control structure further comprises a gate dielectric contacting the outer side of the cylindrical semiconductor structure and an electrically conductive line connected with the gate dielectric.

7. The magnetic memory array as in claim 1, wherein the memory element is a magnetic tunnel junction element, and wherein the memory element is electrically connected with the semiconductor structure.

8. The magnetic memory array as in claim 1, wherein the substrate comprises monocrystalline silicon.

9. The magnetic memory array as in claim 1, further comprising an electrode having one or more textures in contact with the silicide.

10. The magnetic memory array as in claim 1, wherein the capping layer includes a silicide of one or various ordering degrees.

11. A magnetic memory array, comprising:
- a silicide seed layer;
- a semiconductor pillar structure formed on the seed layer;
- a gate structure connected with the semiconductor structure; and
- a magnetic memory element, electrically connected with the semiconductor structure;
- wherein at least a portion of the semiconductor pillar structure is monocrystalline.

12. A magnetic memory array as in claim 11, wherein the gate structure includes a gate dielectric layer at least partially surrounding the monocrystalline semiconductor cylinder and an electrically conductive line contacting the gate dielectric such that the gate dielectric is between the semiconductor structure and the electrically conductive line.

13. The magnetic memory array as in claim 11, wherein the silicide seed layer comprises one or more of $CoSi_2$, $TiSi_2$, or $NiS_2$.

14. The magnetic memory array as in claim 11, wherein the magnetic memory element comprises a magnetic tunnel junction element that is formed over the semiconductor structure.

* * * * *